United States Patent
Huang

(10) Patent No.: US 9,401,438 B2
(45) Date of Patent: Jul. 26, 2016

(54) SOLAR CELL MODULE AND SOLAR CELL THEREOF

(71) Applicant: INDUSTRIAL TECHNOLOGY RESEARCH INSTITUTE, Hsinchu (TW)

(72) Inventor: Chien-Rong Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/539,693

(22) Filed: Nov. 12, 2014

(65) Prior Publication Data

US 2015/0129019 A1  May 14, 2015

Related U.S. Application Data

(63) Continuation-in-part of application No. 14/142,377, filed on Dec. 27, 2013.

(30) Foreign Application Priority Data

Nov. 13, 2013 (TW) .............................. 102141349 A

(51) Int. Cl.
*H02N 6/00* (2006.01)
*H01L 31/042* (2014.01)
(Continued)

(52) U.S. Cl.
CPC .... *H01L 31/0201* (2013.01); *H01L 31/022425* (2013.01); *H01L 31/035281* (2013.01); *H01L 31/0445* (2014.12); *H01L 31/0504* (2013.01); *H01L 31/0508* (2013.01); *Y02E 10/50* (2013.01)

(58) Field of Classification Search
CPC . H01L 31/042; H01L 31/043; H01L 31/0465; H01L 31/0475; H01L 31/048; H01L 31/05; H01L 31/0504; H01L 31/0508; H01L 31/02002; H01L 31/02008; H01L 31/02013; H01L 31/0224; H01L 31/022408; H01L 31/022425; H01L 31/0201; H01L 31/035281; H02S 40/36

See application file for complete search history.

(56) References Cited

U.S. PATENT DOCUMENTS 3,837,924 A  9/1974 Baron
4,430,519 A  2/1984 Young
(Continued)

FOREIGN PATENT DOCUMENTS

CN  202940252 U  5/2013
EP    2058870 A2  5/2009
(Continued)

OTHER PUBLICATIONS

A. Schneider et al., A New Approach in Solar Cell Module Interconnection Technique Resulting in 5-10% Higher PV Module Power Output, 2006, IEEE, 2073-2076.
(Continued)

*Primary Examiner* — Eli Mekhlin
(74) *Attorney, Agent, or Firm* — Locke Lord LLP; Tim Tingkang Xia, Esq.

(57) ABSTRACT

A solar cell module includes a first solar cell, a second solar cell and an electrically connecting member. The first solar cell has a first connecting side having at least one first protruding portion and at least one first recess portion that are adjacent to each other. The second solar cell has a second connecting side having at least one second protruding portion and at least one second recess portion that are adjacent to each other. The shape of the first protruding portion matches the shape of the second recess portion while the shape of the first recess portion matches the shape of the second protruding portion. The electrically connecting member electrically connects the first upper electrode layer of the first solar cell and the second lower electrode layer of the second solar cell.

21 Claims, 25 Drawing Sheets

(51) Int. Cl.
*H01L 31/02* (2006.01)
*H01L 31/0224* (2006.01)
*H01L 31/0352* (2006.01)
*H01L 31/05* (2014.01)
*H01L 31/0445* (2014.01)

(56) References Cited

U.S. PATENT DOCUMENTS

| | | | |
|---|---|---|---|
| 4,542,258 | A | 9/1985 | Francis et al. |
| 5,006,179 | A | 4/1991 | Gaddy |
| 5,100,808 | A | 3/1992 | Glenn |
| 6,117,703 | A | 9/2000 | Penndorf |
| 6,248,948 | B1 * | 6/2001 | Nakagawa ............ H01L 31/042 136/244 |
| 7,122,398 | B1 | 10/2006 | Pichler |
| 7,235,736 | B1 | 6/2007 | Buller et al. |
| 7,276,724 | B2 | 10/2007 | Sheats et al. |
| 7,732,232 | B2 | 6/2010 | Sheats et al. |
| 8,138,412 | B2 | 3/2012 | Weibezahn |
| 8,247,243 | B2 | 8/2012 | Sheats et al. |
| 2008/0023068 | A1 | 1/2008 | Nakashima et al. |
| 2008/0302030 | A1 | 12/2008 | Stancel et al. |
| 2009/0255565 | A1 | 10/2009 | Britt et al. |
| 2009/0266398 | A1 | 10/2009 | Metin et al. |
| 2010/0031996 | A1 | 2/2010 | Basol |
| 2010/0043863 | A1 | 2/2010 | Wudu et al. |
| 2011/0108087 | A1 | 5/2011 | Croft et al. |
| 2011/0155203 | A1 | 6/2011 | Funakoshi |
| 2011/0155219 | A1 | 6/2011 | Ma et al. |
| 2012/0000502 | A1 | 1/2012 | Wiedeman et al. |
| 2012/0000510 | A1 | 1/2012 | Wiedeman et al. |
| 2012/0006378 | A1 | 1/2012 | Kanto et al. |
| 2012/0138117 | A1 | 6/2012 | Krajewski |
| 2012/0152325 | A1 | 6/2012 | Podkin et al. |
| 2012/0234375 | A1 | 9/2012 | Nakamura et al. |
| 2013/0146123 | A1 | 6/2013 | Park |
| 2013/0284240 | A1 | 10/2013 | Milshtein et al. |

FOREIGN PATENT DOCUMENTS

| | | |
|---|---|---|
| TW | 200929561 A | 7/2009 |
| TW | M384239 U | 7/2010 |
| TW | 201135951 A | 10/2011 |
| TW | 201431935 A | 8/2014 |
| TW | 201442268 A | 11/2014 |

OTHER PUBLICATIONS

M.E. Beck et al., Advancements in Flexible CIGS Module Manufacturing, 2005, IEEE, 211-214.

Dr. Steffen Schuler, Advances in flexible CIGS BIPV modules, 2011, Global Solar High Efficiency Flexible CIGS, 2nd CIGS workshop, PVCOMB, Berlin, Germany.

F. Kessler et al., Approaches to flexible CIGS thin-film solar cells, 2005, Thin Solid Films, 491-498.

MiaSolé, CIGS Efficiency Increase in Production, 2012, 3rd International workshop on CIGS Cell Technology, Berlin, Germany.

M. Powalla et al., CIGS Solar Modules: Progress in Pilot Production, New Developments and Applications, 2004, 19th European Photovoltaic Solar Energy Conference.

M. Murugesan et al., Cu Lateral Interconnects Formed Between 100-μm-Thick Self-Assembled Chips on Flexible Substrates, 2009, Electronic Components and Technology Conference, 1496-1501.

P.-O Westin et al., Next generation interconnective laser patterning of CIGS thin film modules, 2011, Solar Energy Materials & Solar Cells, 1062-1068.

Barbara Terheiden et al., Series-Connection of Thin-Film Crystalline Si Solar Modules with a Single Metallisation Step, 2004, 19th European Photovoltaic Solar Energy Conference, 463-466, Paris, France.

Kajsa Sols, Simulation of solar cell losses depending on cell design—A study of CIGS solar cells at Solarion AG, 2010, Sweden.

Friedrich Kessler et al., Technological aspects of flexible CIGS solar cells and modules, 2004, Solar Energy, 685-695.

Intellectual Property Office, Ministry of Economic Affairs, R. O. C., "Office Action", Feb. 25, 2016, Taiwan.

* cited by examiner

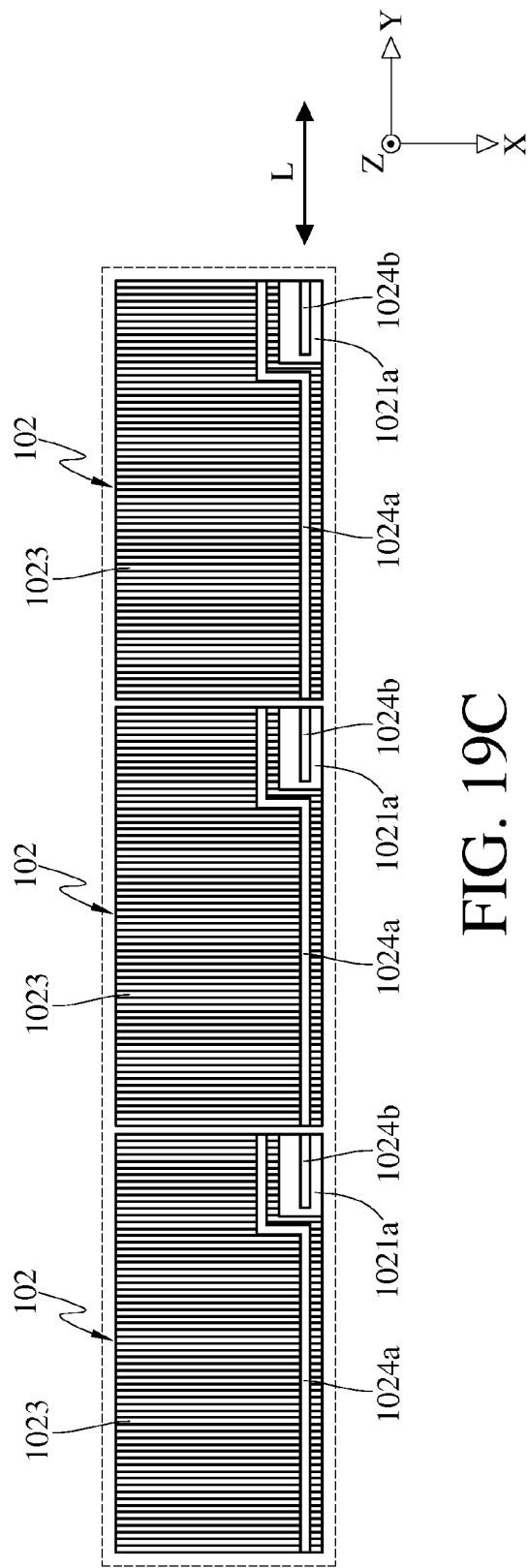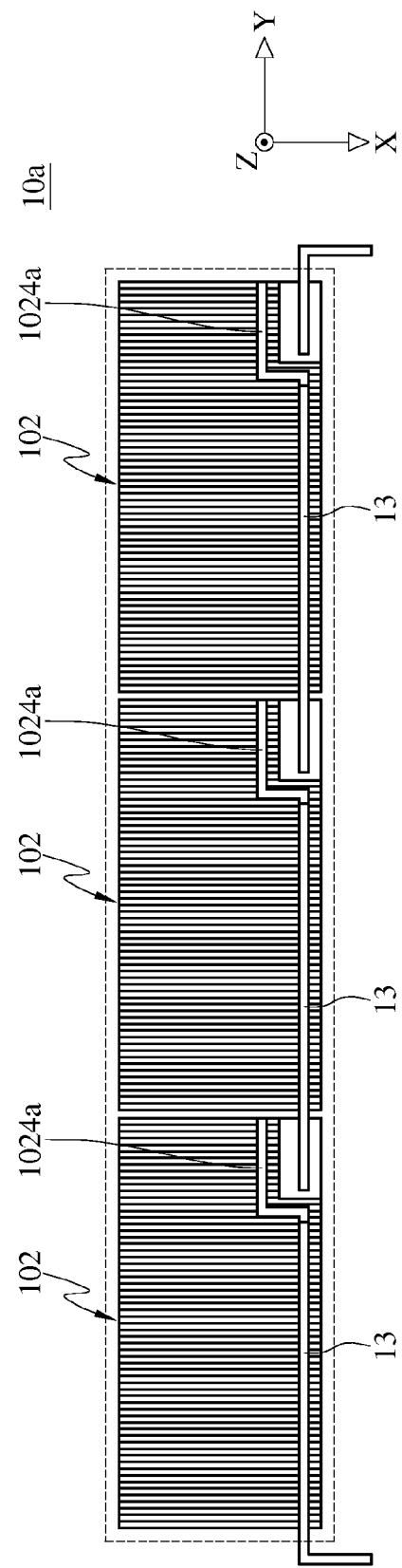
FIG. 19C
FIG. 19D

SOLAR CELL MODULE AND SOLAR CELL THEREOF

CROSS-REFERENCE TO RELATED APPLICATIONS

This application is a continuation-in-part of: U.S. patent application Ser. No. 14/142,377, entitled "SOLAR CELL MODULE", filed 2013 Dec. 27, the entire contents of which are hereby incorporated by reference for which priority is claimed under 35 U.S.C. §120. This non-provisional application claims priority under 35 U.S.C. §119(a) on Patent Application No(s). 102141349 filed in Taiwan, R.O.C. on 2013 Nov. 13, the entire contents of which are hereby incorporated by reference.

TECHNICAL FIELD

The disclosure relates to a solar cell module and a solar cell thereof.

BACKGROUND

In current solar cell technology, a photoelectric conversion active layer or an absorber is used for converting light energy, from the sun for example, into electrical energy. A solar cell has an upper electrode layer and a lower electrode layer on the upper surface and the lower surface of the absorber, respectively. When receiving light, the absorber separates electric charges to the upper electrode layer and the lower electrode layer, thereby generating voltages and currents. The photo-generated voltages and currents can vary due to different material properties of the absorbers, as well as different light receiving areas and illuminating intensity of the solar cells. Under the same illuminating intensity, the photocurrent increases as the light receiving area rises. The output voltages, however, cannot be increased by increasing the light receiving area. The electrical power tends to be wasted under the circumstance of lower voltage with high current. Hence, isolated solar cells are interconnected in series to raise the output voltage of a solar cell module, thereby avoiding the waste of electrical power. In addition, these isolated solar cells can be connected in parallel for raising the current if needed.

Typically, solar cells are cut into rectangular shapes. For the serial interconnection of the first solar cell and the second solar cell, manufactures may arrange them next to each other (namely, side by side) with their upper electrode layer facing up, and using a conductive material to electrically connect the upper electrode layer of the first solar cell with the lower electrode layer of the second solar cell. The manufactures usually make the conductive material electrically connect to the upper electrode layer of the first solar cell, and then make the conductive material run through the gap between the first solar cell and the second solar cell. Subsequently, the manufactures flip the first solar cell and the second solar cell to make their lower electrode layers face up, and making the conductive material in the gap electrically connect to the lower electrode layer of the second solar cell. However, there should be enough space for the solar cells to flip upside down, especially when there are many of them interconnected in series.

Consequently, a method for interconnecting solar cells without flipping them was developed. In this method, manufactures made the upper electrode layer of the first solar cell and the lower electrode layer of the second solar cell face up before electrically connecting them with a conductive material with enough width for making the interconnection. Although this approach does not need to flip over the solar cells, it wastes a large amount of conductive materials. In addition, a larger area of the solar cell is blocked by the conductive material so that the conversion efficiency is worsened. Moreover, the alignment of the conductive material has to match the positions of the first and the second solar cells precisely to avoid poor electrical interconnection. This makes the manufacturing of the solar cell module difficult.

SUMMARY

According to one aspect of the disclosure, a solar cell module comprises a first solar cell, a second solar cell and an electrically connecting member. The first solar cell comprises a first upper electrode layer, a first photoelectric conversion active layer and a first lower electrode layer. The first photoelectric conversion active layer is disposed between the first upper electrode layer and the first lower electrode layer, and the first solar cell has a first connecting side having at least one first protruding portion and at least one first recess portion that are adjacent to each other. The second solar cell comprises a second upper electrode layer, a second photoelectric conversion active layer and a second lower electrode layer. The second photoelectric conversion active layer is disposed between the second upper electrode layer and the second lower electrode layer. The second solar cell has a second connecting side having at least one second protruding portion and at least one second recess portion that are adjacent to each other. The second lower electrode layer of the second protruding portion has a first exposed section. The first solar cell is arranged next to the second solar cell, and the shape of the first protruding portion matches the shape of the second recess portion while the shape of the first recess portion matches the shape of the second protruding portion. The electrically connecting member is disposed on the first upper electrode layer of the first protruding portion and the first exposed section of the second lower electrode layer of the second protruding portion. The electrically connecting member electrically connects the first upper electrode layer and the second lower electrode layer.

According to another aspect of the disclosure, a solar cell comprises a photoelectric conversion active layer, an upper electrode layer, a lower electrode layer and a wire. The photoelectric conversion active layer comprises two surfaces opposite to each other. The upper electrode layer is disposed on one of the surfaces of the photoelectric conversion active layer. The lower electrode layer is disposed on the other surface of the photoelectric conversion active layer. The lower electrode layer comprises an exposed section facing the photoelectric conversion active layer. Both of the photoelectric conversion active layer and the upper electrode layer do not cover the exposed section so as to expose the exposed section which is adjacent to an edge of the lower electrode layer. The wire is disposed on the upper electrode layer and adjacent to the exposed section.

According to yet another aspect of the disclosure, a solar cell module comprises a first solar cell, a second solar cell and an electrically connecting member. The first solar cell comprises a first upper electrode layer, a first photoelectric conversion active layer, a first lower electrode layer and a first wire. The first photoelectric conversion active layer is disposed between the first upper electrode layer and the first lower electrode layer. The first lower electrode layer comprises a first exposed section facing the first photoelectric conversion active layer. Both of the first photoelectric conversion active layer and the first upper electrode layer do not cover the first exposed section so as to expose the first exposed section which is adjacent to an edge of the first lower electrode layer. The first wire is disposed on the first upper electrode layer and adjacent to the first exposed section. The second solar cell comprises a second upper electrode layer, a second photoelectric conversion active layer, a second lower electrode layer and a second wire. The second photoelectric conversion active layer is disposed between the second upper electrode layer and the second lower electrode layer. The second lower electrode layer comprises a second exposed section facing the second photoelectric conversion active layer. Both of the second photoelectric conversion active layer and the second upper electrode layer do not cover the second exposed section so as to expose the second exposed section which is adjacent to an edge of the second lower electrode layer. The second wire is disposed on the second exposed section of the second lower electrode layer. The first solar cell and the second cell are arranged side by side. The first wire is adjacent to the second wire. The electrically connecting member is disposed on the first wire and the second wire, and the electrically connecting member is in electrical contact with the first wire and the second wire.

BRIEF DESCRIPTION OF THE DRAWINGS

The present disclosure will become more fully understood from the detailed description given herein below, along with the accompanying drawings which are for illustration only, thus are not limitative of the present disclosure, and wherein:

FIG. 19C is a top view of the multiple solar cells shown in FIG. 19B;

FIG. 19D is a top view of a solar cell module including the solar cell shown in FIG. 19B;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
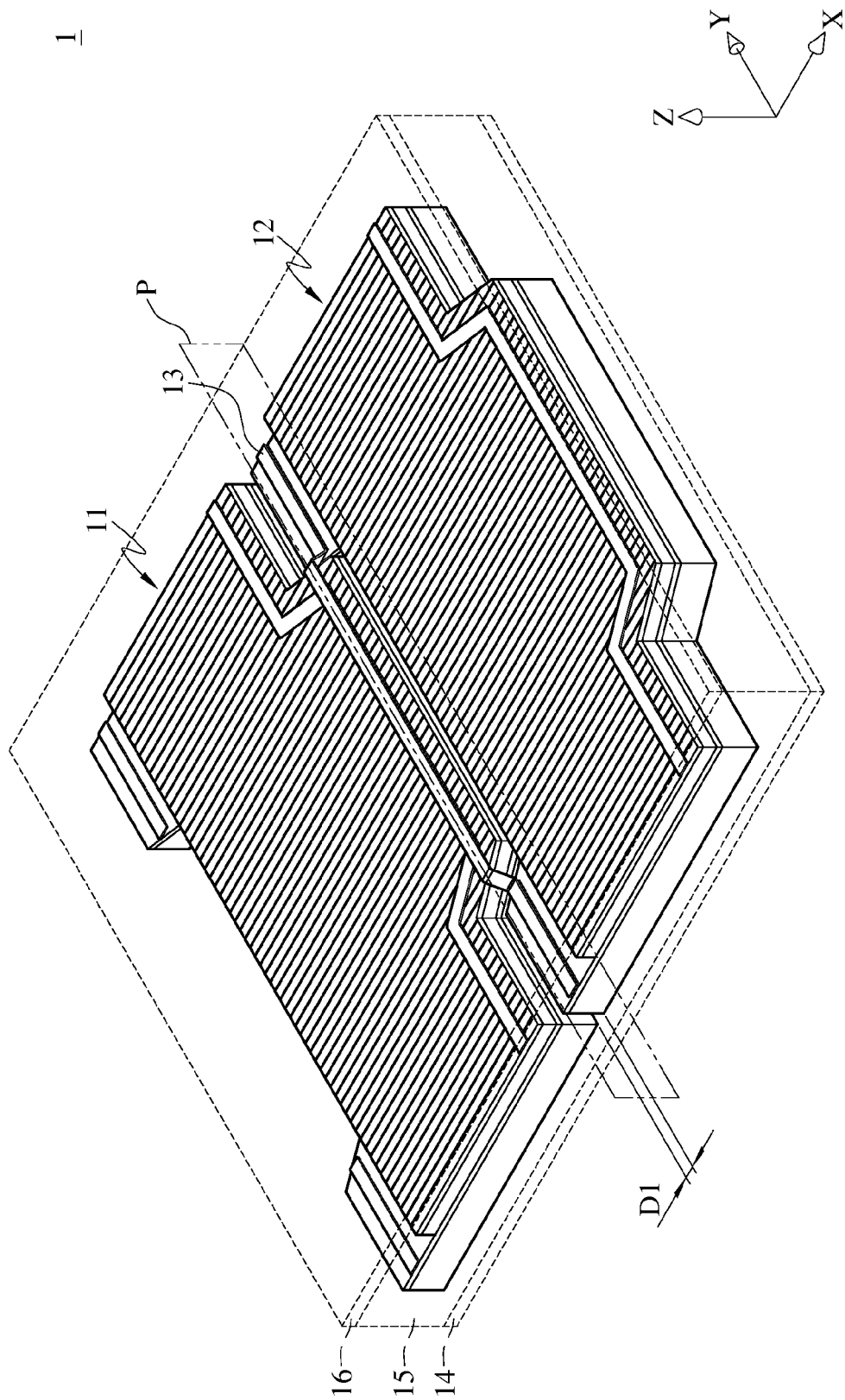
FIG. 1 is a perspective view of a solar cell module according to an embodiment of the disclosure.
Figure 2A:
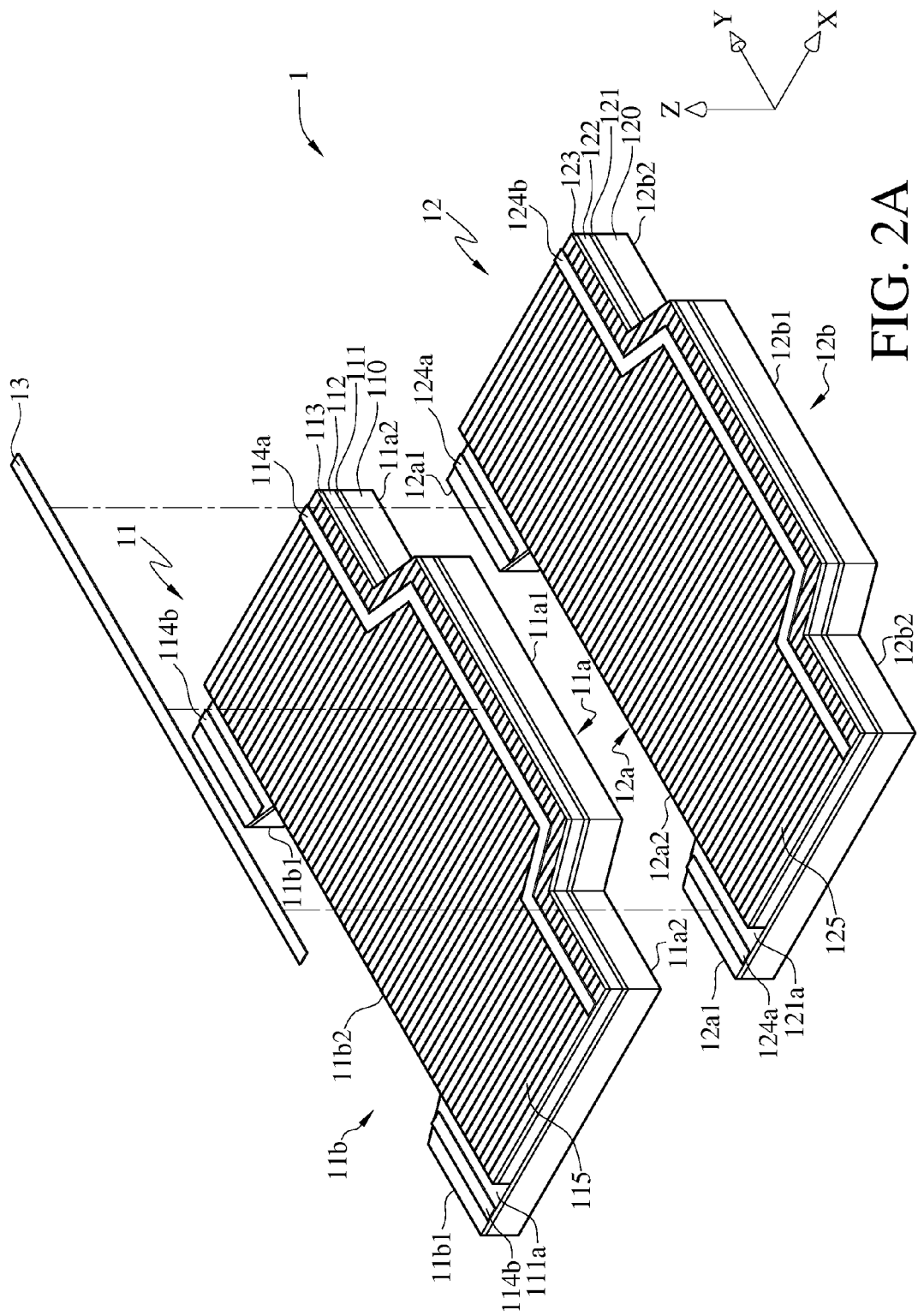
FIG. 2A is an exploded view of FIG. 1.
Figure 2B:
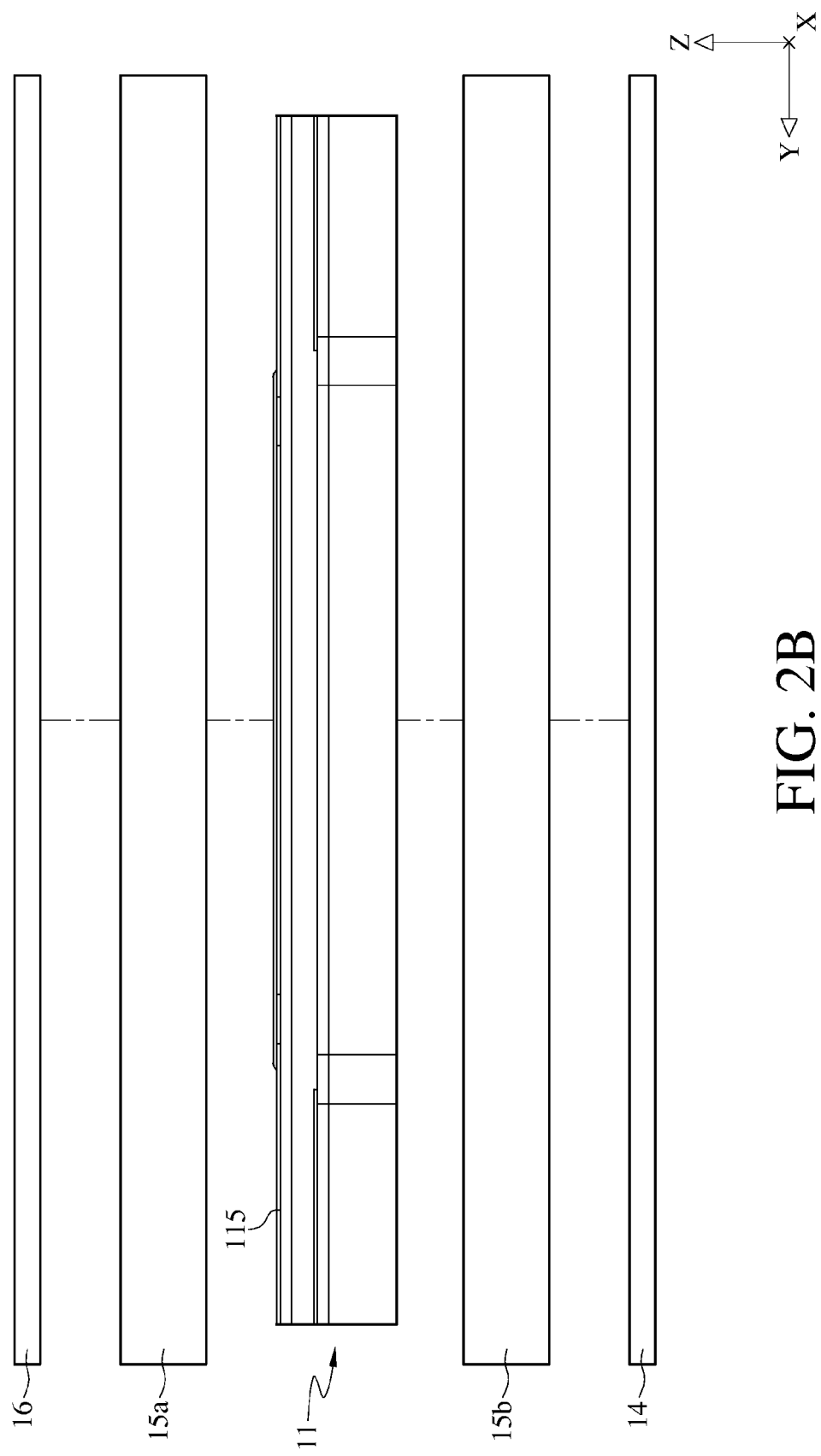
FIG. 2B is a side view of FIG. 2A.

FIG. 1 is a perspective view of a solar cell module according to an embodiment of the disclosure; FIG. 2A is an exploded view of FIG. 1; FIG. 2B is a side view of FIG. 2A. As seen in FIG. 1, FIG. 2A and FIG. 2B, in this embodiment, solar cell module 1 comprises a first solar cell 11, a second solar cell 12, an electrically connecting member 13, a back plate 14, a plurality of adhesive layers 15, 15a, 15b and a cover plate 16.

The first solar cell 11 comprises a first substrate 110, a first lower electrode layer 111, a first photoelectric conversion active layer 112, a first upper electrode layer 113, a first wire 114a and a plurality of first charge collecting fingers 115. As shown from the bottom to the top in the figures, the first lower electrode layer 111 is disposed on the first substrate 110, the first photoelectric conversion active layer 112 is disposed on the first lower electrode layer 111, the first upper electrode layer 113 is disposed on the first photoelectric conversion active layer 112, and the first charge collecting finger 115 is disposed on the first upper electrode layer 113. Therefore, the first lower electrode layer 111 is located between the first substrate 110 and the first photoelectric conversion active layer 112, while the first photoelectric conversion active layer 112 is located between the first lower electrode layer 111 and the first upper electrode layer 113. The material of the first substrate 110 can be a plastic substrate (e.g. polyimide, PI) or a metal substrate (e.g., stainless steel foil, aluminum foil or titanium foil). The material of the first lower electrode layer 111 can be a metal conductive layer, such as molybdenum (Mo), nickel (Ni), aluminum (Al), copper (Cu) and chromium (Cr), or a metal alloy layer made of combinations of the foregoing materials. The material of the first photoelectric conversion active layer 112 can be a thin photovoltaic film such as copper indium gallium diselenide (CIGS), amorphous silicon (a-Si), cadmium telluride (CdTe). The material of the first upper electrode layer 113 can be a thin transparent conductive oxide film such as aluminum doped zinc oxide (AZO), boron doped zinc oxide (BZO), indium tin oxide (ITO). The material of the first charge collecting finger 115 can be a metal conductive layer, such as silver, copper, aluminum and nickel, or a metal alloy layer made of combinations of the foregoing materials. The first lower electrode layer 111, the first photoelectric conversion active layer 112 and the first upper electrode layer 113 can be stacked as a thin film solar cell, and the total thickness is about 0.5 μm to 5 μm.

The first solar cell 11 has a first connecting side 11a and a third connecting side 11b opposite to the first connecting side 11a. The first connecting side 11a has at least one first protruding portion 11a1 and at least one first recess portion 11a2 that are adjacent to each other. The third connecting side 11b has at least one third protruding portion 11b1 and at least one third recess portion 11b2 that are adjacent to each other. In this embodiment, both the number of the first protruding portion 11a1 and that of the third recess portion 11b2 are one, but they are not limited thereto. In this embodiment, both the number of the first recess portion 11a2 and that of the third protruding portion 11*b*1 are also two, but they are not limited thereto. In this embodiment, the first protruding portion 11*a*1, the first recess portion 11*a*2, the third protruding portion 11*b*1 and the third recess portion 11*b*2 are all trapezoid shapes, but the disclosure is not limited thereto. Moreover, the shapes of them may be the same or different from each other.

The first wire 114*a* can be disposed on the first upper electrode layer 113 by sputtering, screen printing or attachment, and the first wire 114*a* is next to the first connecting side 11*a*. The first wire 114*a* can be a double layer material with an upper layer and a lower layer. The lower layer of the first wire 114*a*, which is in contact with the first upper electrode layer 113, is an electric charge collecting material. The upper layer of the first wire 114*a* is an electrically conductive bonding material for electrical connection between the first wire 114*a* and the electrically connecting member 13. For example, manufacturer can fabricate the lower layer of the first wire 114*a* (electric charge collecting material) after fabricating the first charge collecting fingers 115. Then, the upper layer of the first wire 114*a* (electrically conductive bonding material) is formed on the lower layer of the first wire 114*a*. In other embodiments, the first charge collecting fingers 115 and the lower layer of the first wire 114*a* are fabricated at the same time before the upper layer of the first wire 114*a* is formed on the lower layer of the first wire 114*a*.

When light (e.g., sunlight) enters into the first solar cell 11, the first photoelectric conversion active layer 112 generates electric charges. Then, these electric charges are collected and transferred to the first wire 114*a* via the first upper electrode layer 113, and the first charge collecting finger 115. The material of the lower layer of the first wire 114*a* (electric charge collecting material) can be a metal conductive layer, such as silver, copper, aluminum and nickel, or a metal alloy layer made of combinations of the foregoing materials. The material of the upper layer (electrically conductive bonding material) of the first wire 114*a* may be solder, indium (In), silver paste, copper paste, anisotropic conductive film (ACF). The first lower electrode layer 111 on the third protruding portion 11*b*1 has a second exposed section 111*a*. The first electrode layer 113 and the first photoelectric conversion active layer 112 do not cover the second exposed section 111*a* of the first lower electrode layer 111. The first solar cell 11 further comprises a third wire 114*b* disposed on the second exposed section 111*a* of the first lower electrode layer 111. When receiving the light, the first photoelectric conversion active layer 112 generates the other type of electric charges and these electric charges can be guided to the third wire 114*b* by the first lower electrode layer 111. The conductive material of the third wire 114*b* may be the same or be different from that of the first wire 114*a*.

The second solar cell 12 comprises a second substrate 120, a second lower electrode layer 121, a second photoelectric conversion active layer 122, a second upper electrode layer 113, a second wire 124*a*, and a plurality of second charge collecting fingers 125. As shown from bottom to top in the figures, the second lower electrode layer 121 is disposed on the second substrate 120, the second photoelectric conversion active layer 122 is disposed on the second lower electrode layer 121, the second upper electrode layer 123 is disposed on the second photoelectric conversion active layer 122, and the first charge collecting finger 125 is disposed on the second upper electrode layer 123. Therefore, the second lower electrode layer 121 is located between the second substrate 120 and the second photoelectric conversion active layer 122, while the second photoelectric conversion active layer 122 is located between the second lower electrode layer 121 and the second upper electrode layer 123. The material of the second substrate 120 can be plastic substrate (e.g. polyimide, PI) or metal substrate (e.g. stainless steel foil, aluminum foil or titanium foil). The material of the second lower electrode layer 121 can be a metal conductive layer such as molybdenum (Mo), aluminum (Al), nickel (Ni), copper (Cu) and chromium (Cr), or a metal alloy layer made of combinations of the foregoing materials. The material of the second photoelectric conversion active layer 122 can be thin photovoltaic film such as copper indium gallium diselenide (CIGS), amorphous silicon (a-Si), cadmium telluride (CdTe). The material of the upper electrode layer 113 can be the conductive thin film such as aluminum doped zinc oxide (AZO), boron doped zinc oxide (BZO), indium tin oxide (ITO). The material of the first charge collecting finger 125 can be a metal conductive layer, such as, silver, copper, aluminum and nickel, or a metal alloy layer made of combinations of the foregoing materials. The second lower electrode layer 121, the second photoelectric conversion active layer 122 and the second upper electrode layer 123 can be stacked as a thin film solar cell, and the total thickness is about 0.5 μm to 5 μm.

The second solar cell 12 has a second connecting side 12*a* and a fourth connecting side 12*b* opposite to the second connecting side 12*a*. The second connecting side 12*a* has at least one second protruding portion 12*a*1 and at least one second recess portion 12*a*2 that are adjacent to each other. The fourth connecting side 12*b* has at least one fourth protruding portion 12*b*1 and at least one fourth recess portion 12*b*2 adjacent to each other. In this embodiment, both the number of the second protruding portion 12*a*1 and that of the fourth recess portion 12*b*2 are one, but they are not limited thereto. In this embodiment, both the number of the second recess portion 12*a*2 and that of the fourth protruding portion 12*b*1 are two, but they are not limited thereto. In this embodiment, the second protruding portion 12*a*1, the second recess portion 12*a*2, the fourth protruding portion 12*b*1 and the fourth recess portion 12*b*2 are all trapezoid shapes, but the disclosure is not limited thereto. Moreover, the shapes of them may be the same or different from each other.

The second lower electrode layer 121 on the second protruding portion 12*a*1 has a first exposed section 121*a*. The second electrode layer 123 and the second photoelectric conversion active layer 122 do not cover the first exposed section 121*a* of the first lower electrode layer 111. The second wire 124*a* can be disposed on the first exposed section 121*a* of the second lower electrode layer 121 and by screen printing, attachment or sputtering. The material of the second wire 124*a* can be the same as the first wire 114*a*, which means the second wire 124*a* can be the double layer including an electrically conductive bonding material on top and an electric charge collecting material on bottom. The upper layer material of the second wire 124*a* may be electrically conductive bonding material such as solder, indium (In), silver paste, copper paste, anisotropic conductive film (ACF). The second solar cell 12 further comprises a fourth wire 124*b*. The fourth wire 124*b* can be disposed on the second upper electrode layer 123 and the second charge collecting finger 125, by screen printing, attachment or sputtering, and the fourth wire 124*b* is next to the fourth connecting side 14*b*. When the light enters into the second solar cell 12, the second photoelectric conversion active layer 122 generates electric charges. Then, these electric charges are collected to the second wire 124*a* via the second upper electrode layer 123 and the second charge collecting finger 125. The conductive material of the fourth wire 124*b* may be the same or be different from that of the second wire 124*a*.

The first solar cell 11 and the second solar cell 12 are arranged next to each other along the positive and negative x direction, and are separated by a distance D1 along the positive and negative x direction. The first connecting side 11a faces the positive x direction, while the second connecting side 12a faces the negative x direction. Therefore, the first protruding portion 11a1 protrudes towards the positive x direction, the first recess portion 11a2 recesses towards the negative x direction; the second protruding portion 12a1 protrudes towards the negative x direction, and the second recess portion 12a2 recesses towards the positive x direction. The first connecting side 11a and the second connecting side 12a are spaced apart by a distance D1. The first protruding portion 11a1 matches the second recess portion 12a2, while the first recess portion 11a2 matches the second protruding portion 12a1. Specifically, the first connecting side 11a and the second connecting side 12a are similar in terms of their appearance. The first protruding portion 11a1 is inserted in the first recess portion 11a2. The first exposed section 121a of the first upper electrode layer 113 and the second lower electrode layer 121 both face towards the positive z direction, and at least one plane P, parallel to the positive and negative z direction, can pass through the first exposed section 121a of the first upper electrode layer 113 and the second lower electrode layer 121. Furthermore, the plane P can pass through the first wire 114a and the second wire 124a of the first protruding portion 11a1. The difference of the height between the first exposed section 121a of the first upper electrode layer 113 and the second lower electrode layer 121 along the positive and negative z direction is less than 0.5 μm to 5 μm.

The electrically connecting member 13 is disposed both on the first upper electrode layer 113 of the first protruding portion 11a1 and the first exposed section 121a of the second lower electrode layer 121 as well as being electrically connected to the first charge collecting finger 115 and the first upper electrode layer 113 via the first wire 114a. Then, the electrically connecting member 13 is electrically interconnected to the second lower electrode layer 121 via the second wire 124a. The electrically connecting member 13 can be attached to the first wire 114a and the second wire 124a along the plane P. That is, viewing from the positive z to negative z direction, the electrically connecting member 13 is a conducting ribbon or a conducting wire extending along the positive and negative y direction. Thereby, even though the electrically connecting member 13 is narrow (e.g. the width thereof is only 2.0 mm or less), it can connect the first solar cell 11 and the second solar cell 12 in series. The margin of error regarding the matching between the first solar cell 11 and the second solar cell 12 can be the width of the first protruding portion 11a1 or of the second protruding portion 12a1 along the positive and negative x direction. Thereby, this makes the manufacturing of the solar cell module 1 easier. Since the width of the electrically connecting member 13 is narrow, the shading area of the first solar cell 11 and the second solar cell 12 is smaller. As a result, the use of the electrically connecting member 13 is reduced so the cost thereof decreases. Moreover, the light receiving areas of the first solar cell 11 and the second solar cell 12 are increased. For instance, the electrically connecting member 13 can be a connection member made of metal with low electrical resistance. The connection member can be a ribbon.

Similarly, if needed, the third connecting side 11b of the first solar cell 11 can be electrically interconnected to other solar cell(s) along the negative x direction by applying this method. The fourth connecting side 12b of the second solar cell 12 can be electrically interconnected to other solar cell(s) along the positive x direction by applying this method.

Although the first exposed section 121a of the first upper electrode layer 113 and the first exposed section 121a of the second lower electrode layer 121 have different heights, the difference thereof is less than 0.5 μm to 5 μm. This difference of height is much less than the thickness of the electrically connecting member 13, typically from 100 μm to 200 μm. Hence, when electrically interconnecting the first upper electrode layer 113 of the electrically connecting member 13 and the second lower electrode layer 121 of the electrically connecting member 13, the difference of height, between the first upper electrode layer 113 and the first exposed section 121a, can be ignored. It should be noted that the drawing scales of FIG. 1, FIG. 2A and FIG. 2B are for reference only and they may not reflect the scale of the product perfectly.

As seen in FIG. 1 and FIG. 2B, the first solar cell 11 and the second solar cell 12 are attached to the back plate 14 by the adhesive layer 15b. The cover plate 16 is attached to all the first solar cell 11, the second solar cell 12 and the electrically connecting member 13 by the adhesive layer 15a. The adhesive layers 15a and 15b can infiltrate the gap between the first solar cell 11 and the second solar cell 12, thereby being stuck to each other. When the materials of the adhesive layers 15a and 15b are the same, the adhesive layers 15a and 15b can form the adhesive layer 15 together in FIG. 1, after being attached to each other. The material of the transparent or non-transparent back plate 14 can be selected from a group consisting of ethylene tetrafluoroethylene (ETFE), polyethylene terephthalate (PET), polyethylene N-phthalate (PEN), polyimide (PI), Tefzel, or Tedlar, plastic substrates, glass substrates, other metal foils (e.g. aluminum foil) and combinations thereof. The material of the transparent cover plate 16 may be selected from a group consisting of ethylene tetrafluoroethylene (ETFE), polyethylene terephthalate (PET), polyethylene N-Phthalate (PEN), polyimide (PI), Tefzel, or Tedlar, plastic substrates, glass substrates, and the combinations thereof. The material of the adhesive layer 15, the adhesive layer 15a and the adhesive layer 15b may be adhesive material such as ethylene vinyl acetate (EVA) or poly vinyl butyral (PVB). The back plate 14 and the cover plate 16 can be made of flexible material such that the solar cell module can be bent into specific shape according to demand or requirement.

In this embodiment, the shapes of the first solar cell 11 and the second solar cell 12 are substantially the same. In detail, the shapes of the first connecting side 11a and the third connecting side 11b are the same, the shapes of the second connecting side 12a and the third connecting side 11b are the same, but the disclosure is not limited thereto. In other embodiments, the shapes of the first connecting side 11a and the third connecting side 11b are different; the shapes of the second connecting side 12a and the third connecting side 11b are different.

FIGS. 3 to 9 are top views of assembly processes of the solar cell modules 1a and 1b. In this embodiment, the first solar cell 11 and the second solar cell 12 are the same for illustrating the assembly processes of the solar cell modules 1a and 1b. The solar cell modules 1a and 1b have more first solar cell 11, arranged next to each other and electrically interconnected to each other, than the solar cell module 1.

Figure 3:
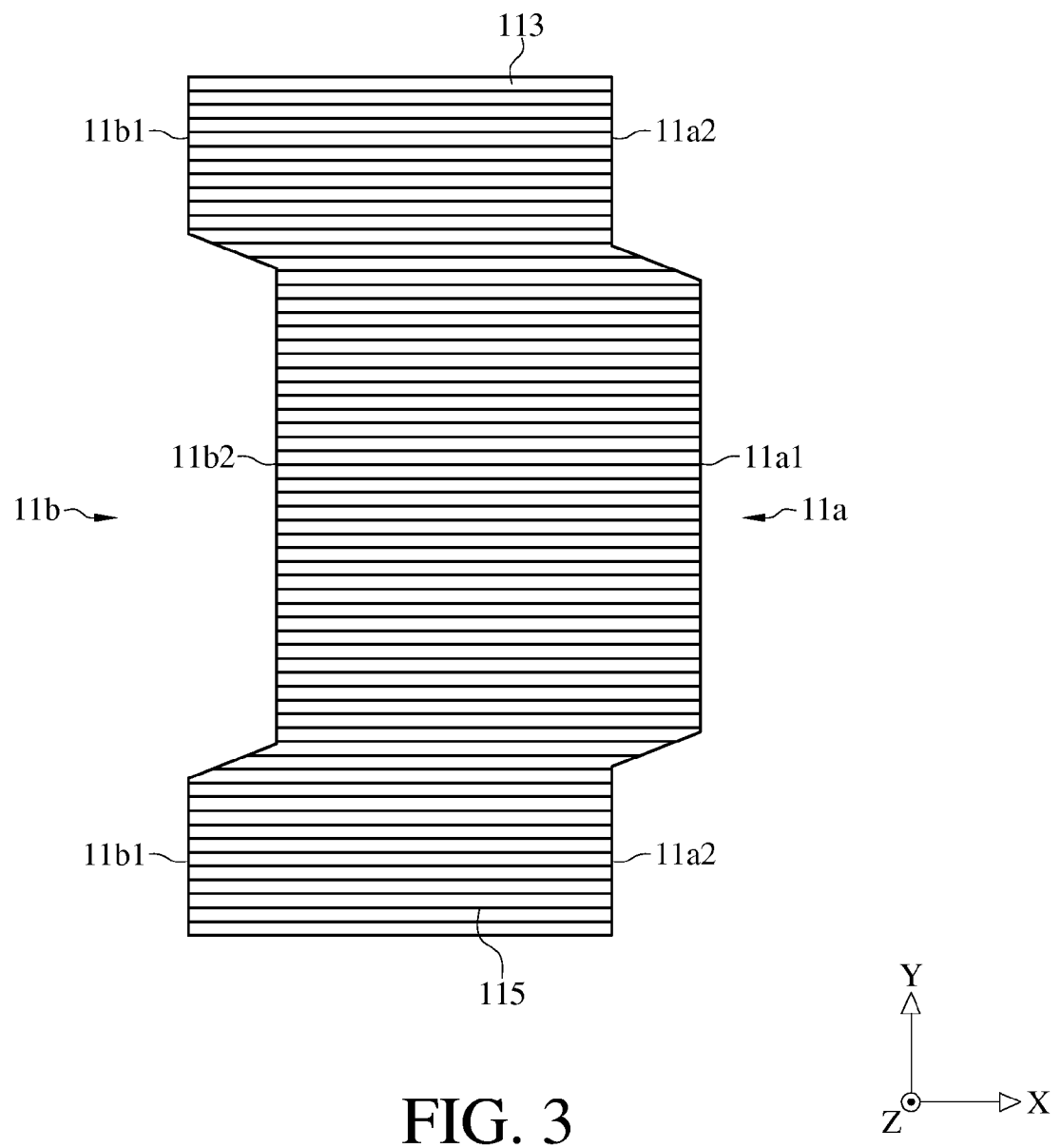
FIG. 3 to FIG. 9 are top views of assembly processes of the solar cell module.

As seen in FIG. 3 with the above description of FIG. 1 and FIG. 2A, the first lower electrode layer 111 is disposed on the first substrate 110, the first photoelectric conversion active layer 112 is disposed on the first lower electrode layer 111, the first upper electrode layer 113 is disposed on the first photoelectric conversion active layer 112, the first charge collecting finger 115 is disposed on the first upper electrode layer 113. Then, a single unit of the first solar cell 11 is cut from the first substrate 110, the first lower electrode layer 111, the first photoelectric conversion active layer 112, the first upper electrode layer 113, and the first charge collecting finger 115.

Multiple single units of the first solar cell 11 can be cut from the first substrate 110, the first lower electrode layer 111, the first photoelectric conversion active layer 112, the first upper electrode layer 113, and the first charge collecting finger 115. Additionally, the first connecting side 11a is formed along the positive x direction when cutting the single unit of the first solar cell 11, while the third connecting side 11b is formed along the negative x direction. The first connecting side 11a has the first protruding portion 11a1 and the first recess portion 11a2. The third connecting side 11b has the third protruding portion 11b1 and the third recess portion 11b2.

Figure 4:
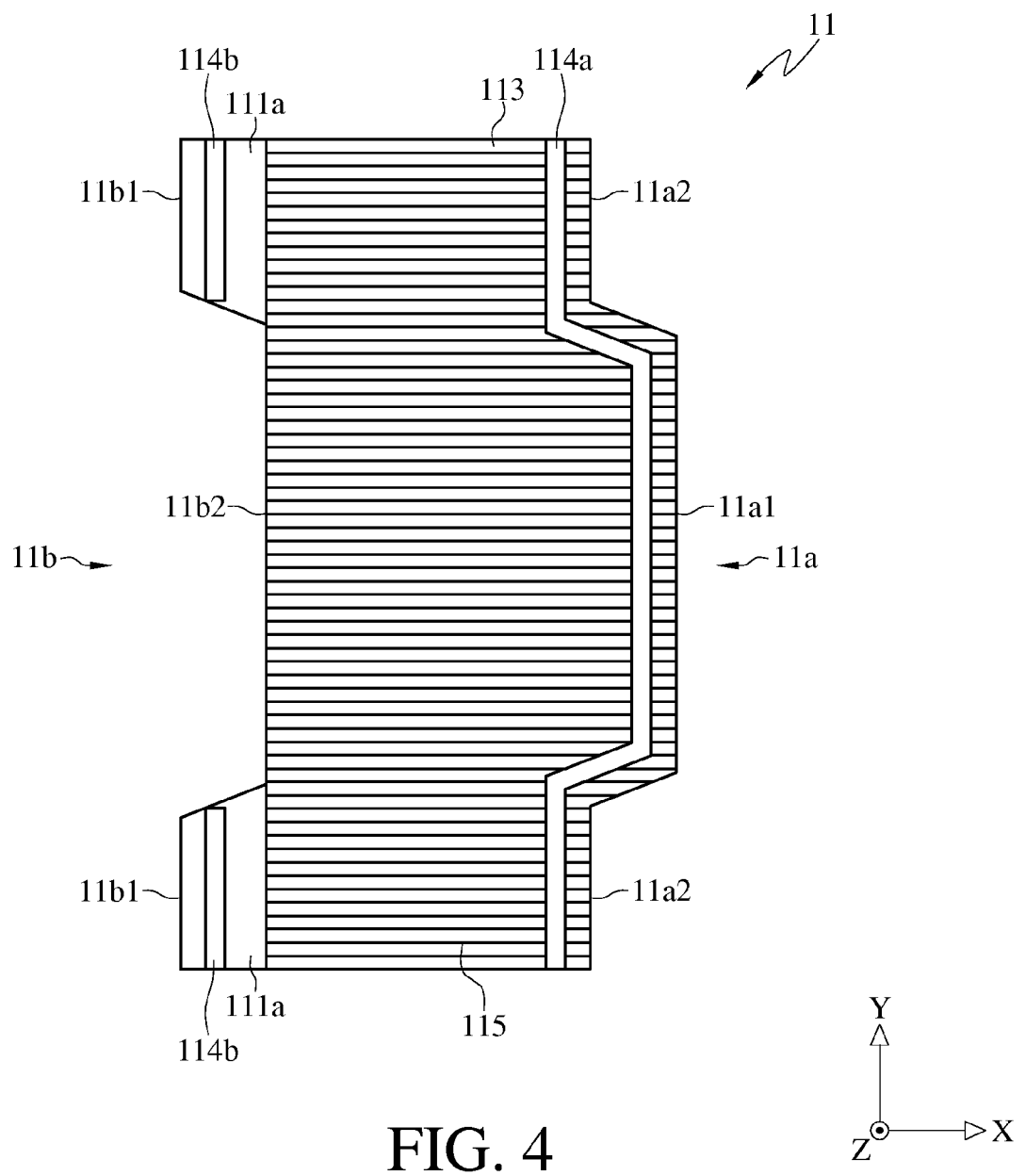

As seen in FIG. 4 in view of FIG. 1 and FIG. 2A, at the position of the third protruding portion 11b1, the first charge collecting finger 115, the first upper electrode layer 113 and the first photoelectric conversion active layer 112 are removed by grinding or scribing, so that the first connecting side 11a of the first lower electrode layer 111 is exposed. Subsequently, the first wire 114a is attached to the first upper electrode layer 113 and the first charge collecting finger 115 by the sputtering, screen printing or attachment, and the first wire 114a is next to the first connecting side 11a. The third connecting side 11b is disposed on the first connecting side 11a of the first lower electrode layer 111 by the sputtering, screen printing or attachment. As a result, the manufacturing of the first solar cell 11 is finished.

Figure 5:
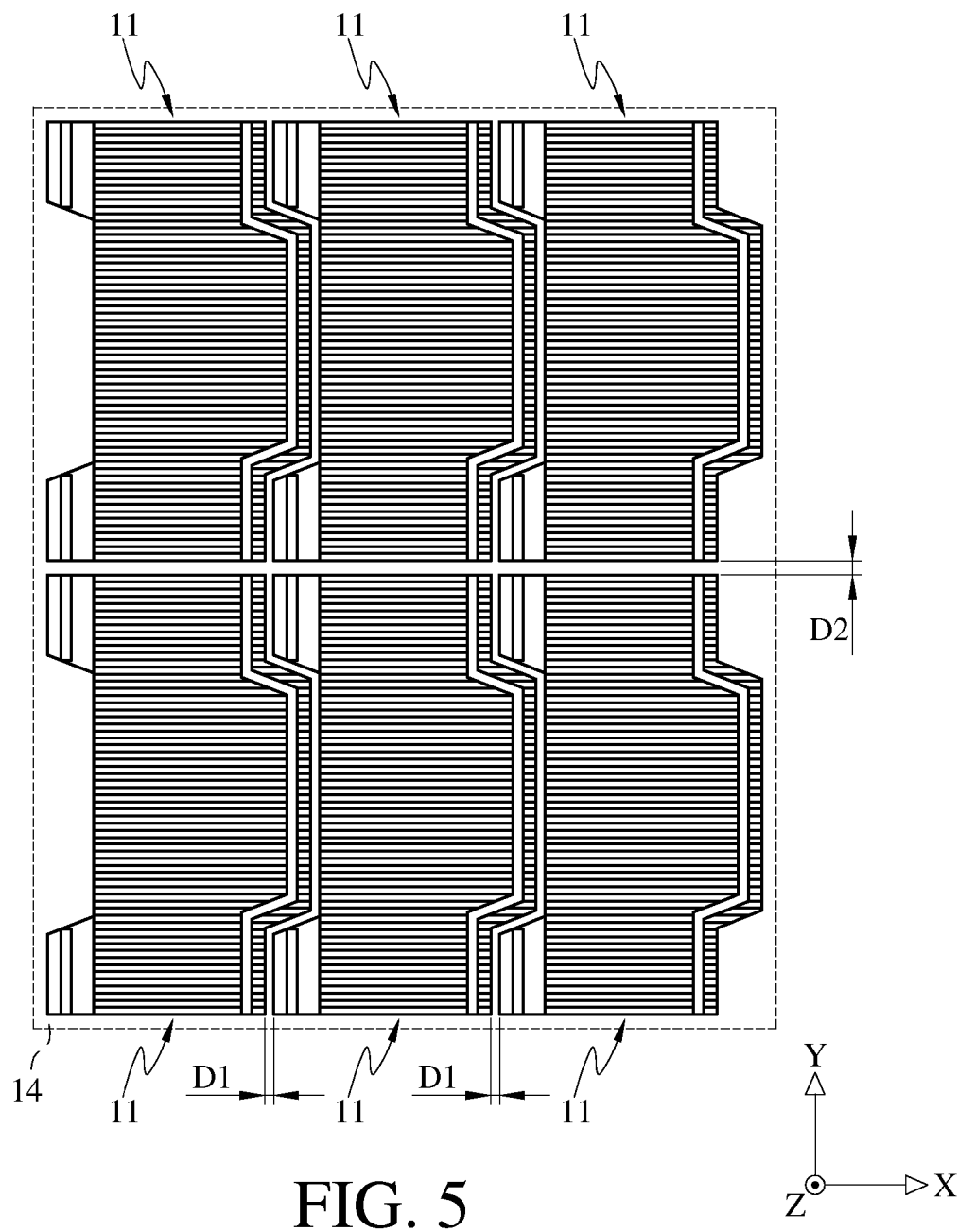
Figure 6:
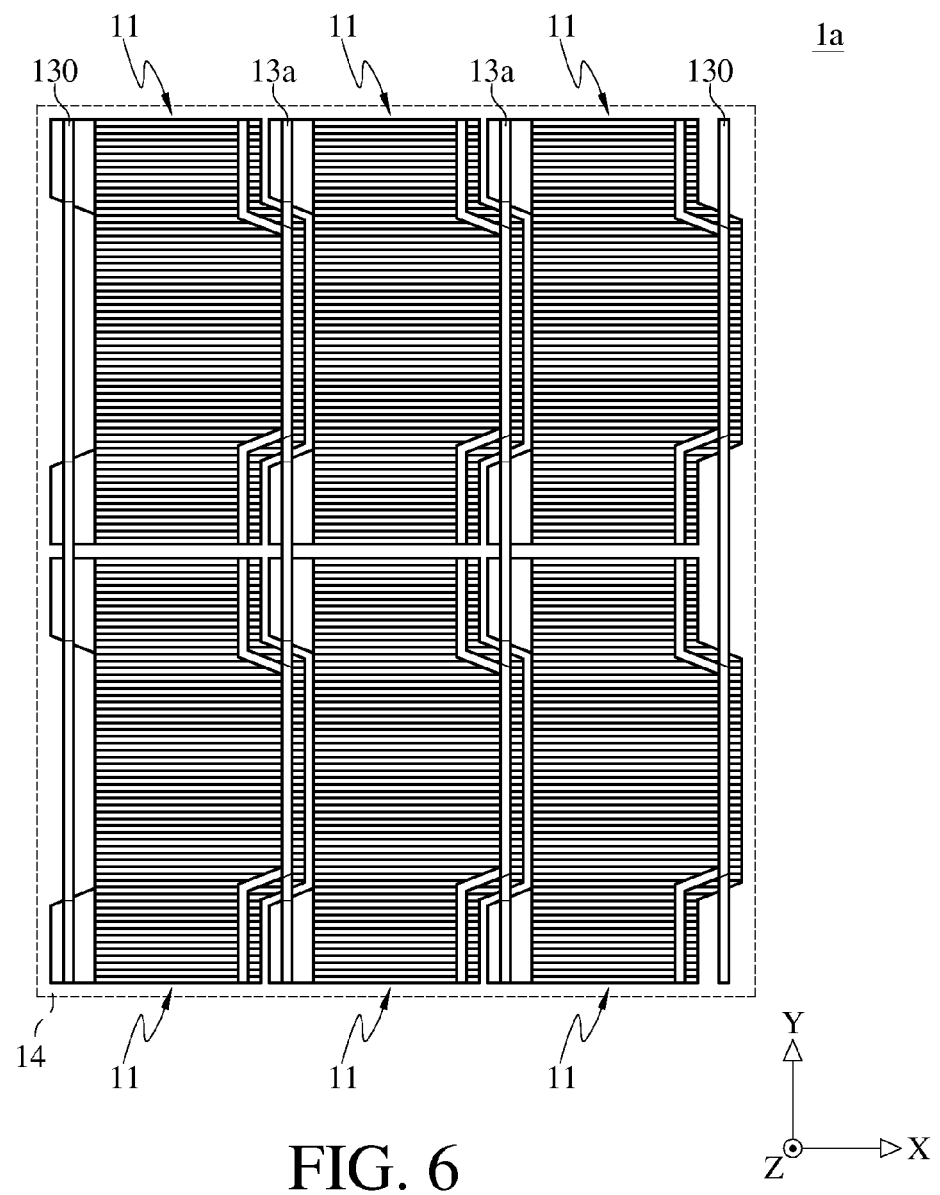

As seen in FIG. 2B, FIG. 4 and FIG. 5, the manufacturers can arrange the first solar cell 11 on the back plate 14 based on the output voltage and the output current. The first solar cell 11 can be attached to the back plate 14 by the adhesive layer 15b. In this embodiment, the first solar cells 11 are arranged as three rows along the positive and negative x directions and two rows along the positive and negative y directions. The first solar cell 11 along the positive and negative x directions are separated by a distance D1, while the first solar cell 11 along the positive and negative y directions are separated by a distance D2. These distances D1 and D2 prevent each the first solar cell 11 from being electrically interconnected to each other. These distances D1 and D2 can be the same or be different from each other. The first protruding portion 11a1 of each the first solar cell 11 corresponds to the third recess portion 11b2 next to the first solar cell 11, while the first recess portion 11a2 corresponds to the third protruding portion 11b1 next to the first solar cell 11.

Figure 7:
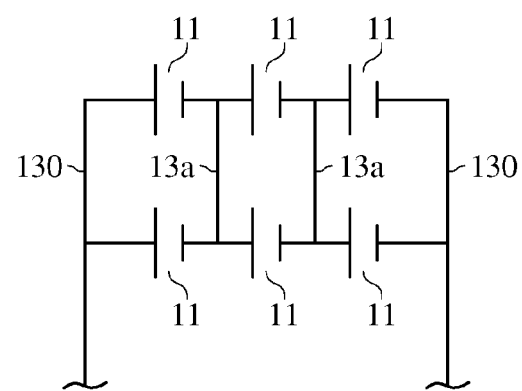

As seen in FIG. 1, FIG. 2A, FIG. 2B and FIG. 6, the electrically connecting member 13a and the electrically connecting member 130 extend along the positive and negative y directions. The electrically connecting member 13a can interconnect the first solar cell 11 along the positive and negative x directions in series via the first protruding portion 11a1 and the third protruding portion 11b1. The electrically connecting member 13a and the electrically connecting member 130 can extend along the positive and negative y directions and interconnect to the first solar cell 11 along the positive and negative y directions in parallel. Subsequently, the cover plate 16 is attached to the first solar cell 11 by the adhesive layer 15a and the package of the solar cell module 1a is finished by lamination process. The equivalent circuit of the solar cell module 1a is shown in FIG. 7. When each first solar cell 11 provides a voltage V and a current A, and the loss is ignored, the solar cell module 1a can output 3V and 2 A, approximately.

Figure 8:
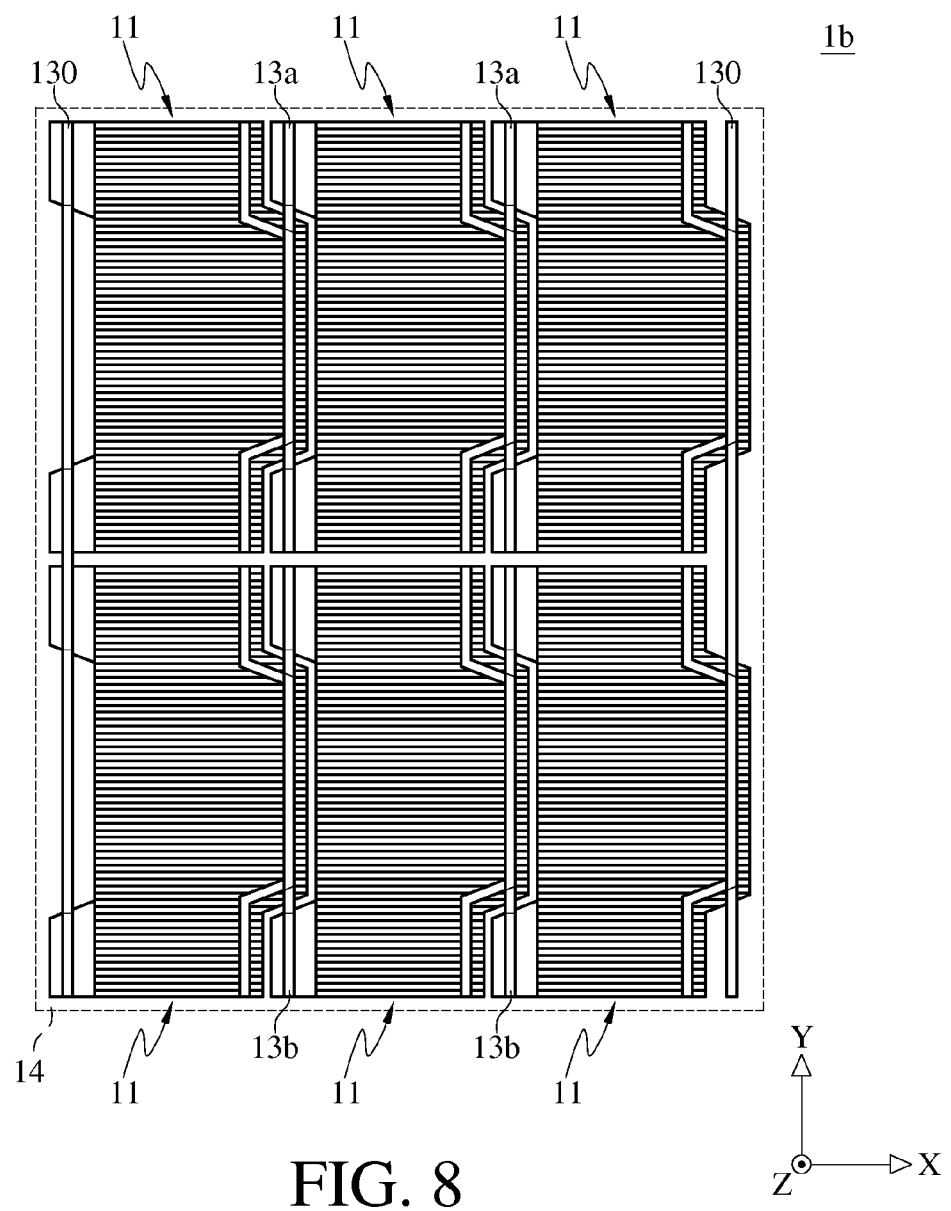
Figure 9:
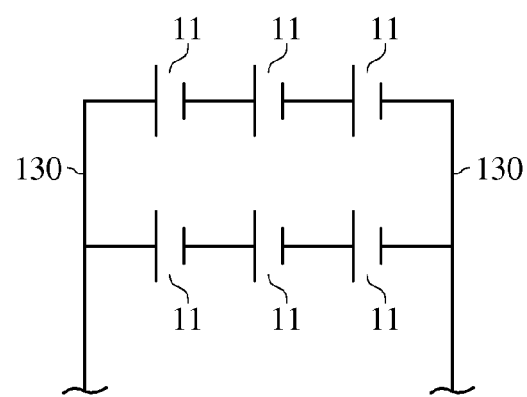

As seen in FIG. 1, FIG. 2A, and FIG. 8, the electrically connecting member 13a, the electrically connecting member 13b and the electrically connecting member 130 all extend along the positive and negative y directions, while the electrically connecting member 13a and the electrically connecting member 13b are cut to be divided from each other so they are not electrically connected. The electrically connecting member 13a and the electrically connecting member 13b can electrically interconnect the first protruding portion 11a1 and the third protruding portion 11b1, so that the first solar cells 11 are interconnected along the positive and negative x directions in series. The electrically connecting member 130 can interconnect the first solar cells 11 along the positive and negative y directions in parallel by extending itself along the positive and negative y directions. Then, the cover plate 16 is attached to the first solar cell 11 via the adhesive layer 15a, and the package of the solar cell module 1b is finished by lamination process. The equivalent circuit of the solar cell module 1b is shown in FIG. 9. When each first solar cell 11 provides a voltage V and a current A, and the loss is ignored, the solar cell module 1a can output 3V and 2 A, approximately.

Figure 10:
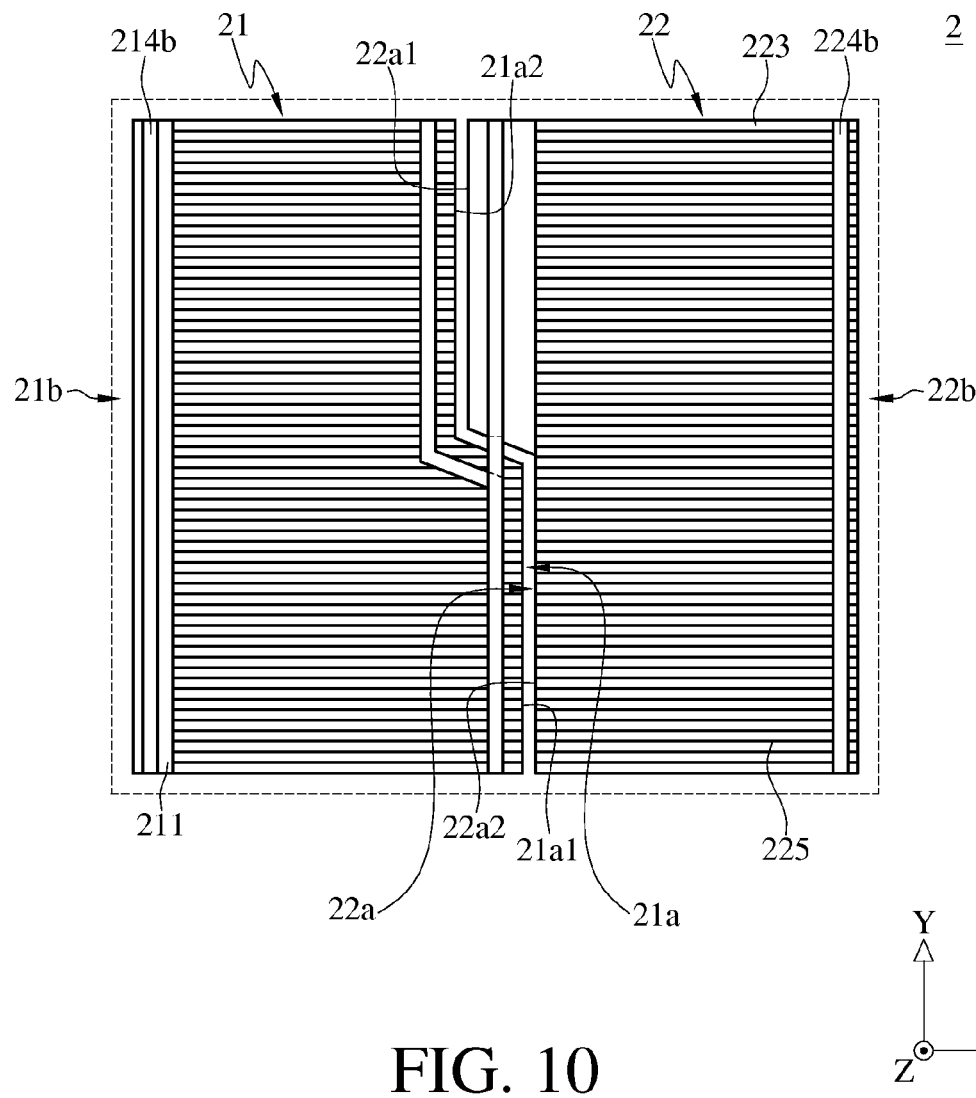
FIG. 10 is a top view of a solar cell module according to another embodiment of the disclosure.

FIG. 10 is a top view of a solar cell module according to another embodiment of the disclosure. As seen in FIG. 10, the solar cell module 2 of this embodiment is similar to the solar cell module 1. Nevertheless, in this embodiment, the first solar cell 21 has the first connecting side 21a and the third connecting side 21b that are opposite to each other, while the second solar cell has the second connecting side 22a and the fourth connecting side 22b that are opposite to each other. The first connecting side 21a has a first protruding portion 21a1 and a first recess portion 21a2. The third connecting side 21b may not have the protruding portion or the recess portion. The second connecting side 22a has a second protruding portion 22a1 and a second recess portion 22a2. The fourth connecting side 22b may not have the protruding portion or the recess portion. The part of the first lower electrode layer 211 which is adjacent to the third connecting side 21b is exposed, and the third wire 214b is disposed on the first lower electrode layer 211. The fourth wire 224b is disposed both on the second upper electrode layer 223 and the second charge collecting finger 225, while the fourth wire 224b is next to the fourth connecting side 22b. Thereby, the manufacturing of the solar cell 2 can apply the example of the first solar cell 21 or the example of the second solar cell based on the requirements, so the configuration of the solar cell 2 is adjustable.

Figure 11:
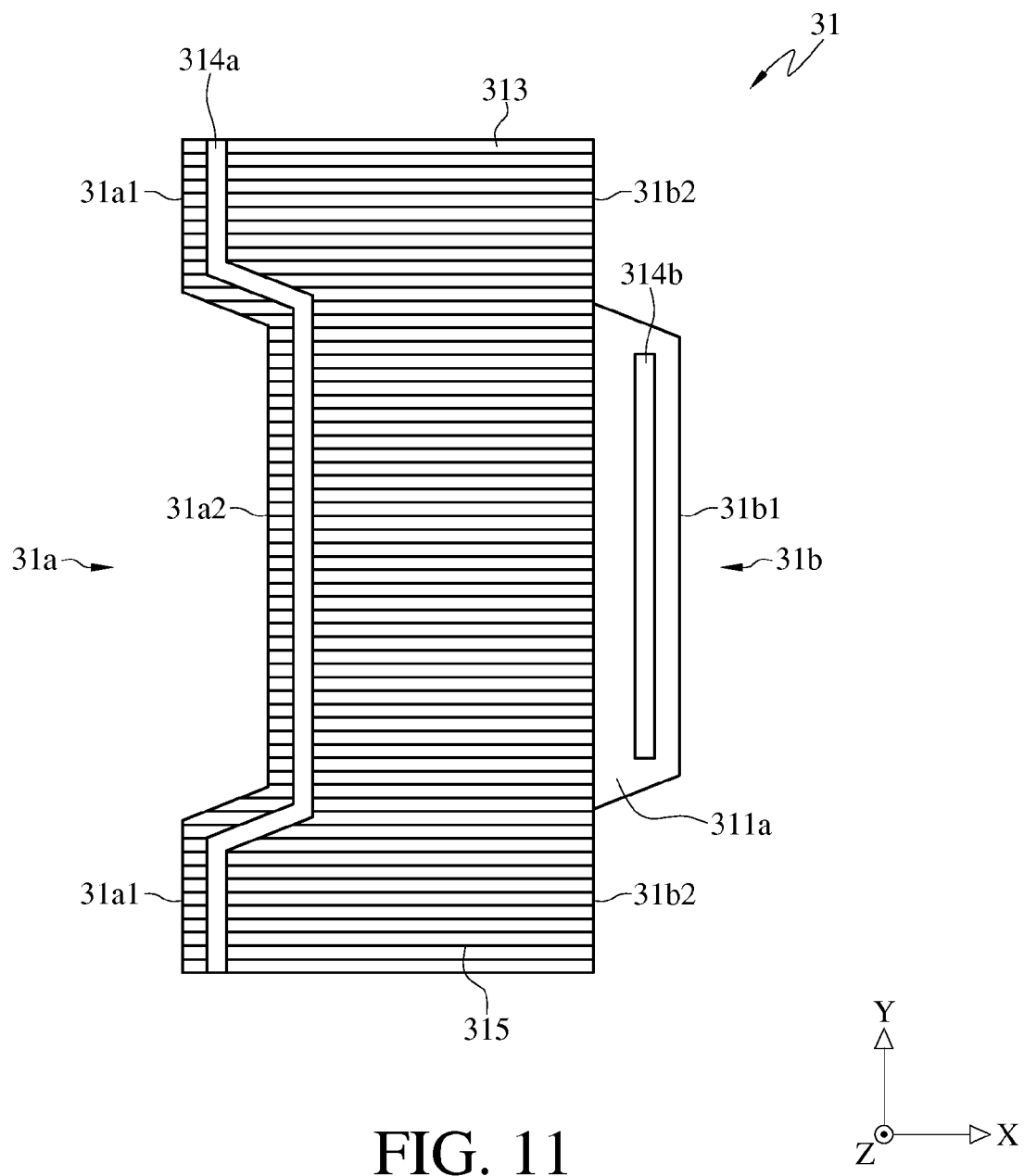
FIG. 11 is a top view of a solar cell according to another embodiment of the disclosure.

FIG. 11 is a top view of a solar cell according to another embodiment of the disclosure. As seen in FIG. 11, the solar cell 31 of this embodiment is similar to the first solar cell 11 shown in FIG. 1, FIG. 2A and FIG. 4. Nonetheless, in this embodiment, the solar cell 31 has the first connecting side 31a and the third connecting side 31b that are opposite to each other. The first connecting side 31a faces the negative x direction and has two first protruding portions 31a1 and one first recess portion 31a2. The third connecting side 31b faces the positive x direction and has a third protruding portion 31b1 and two third recess portions 31b2. The upper electrode layer 313 and the photoelectric conversion active layer (not shown due to being blocked by the upper electrode layer 313) are located on the third protruding portion 31b1 of the third connecting side 31b, and are removed by grinding or scribing, thereby exposing the second exposed section 311a. Subsequently, the first wire 314a is disposed on the upper electrode layers 313 and 315, next to the first connecting side 31a, by sputtering, screen printing, or attachment. The third wire 314b is disposed on the second exposed section 311a of the lower electrode layer by sputtering, screen printing, or attachment. Thereby, the manufacturing of the solar cell 31 is finished. The manufacturers can decide where to locate the second exposed section 311a of the lower electrode layer, so that the arrangement of the solar cell 31 in the solar cell module is adjustable.

Figure 12:
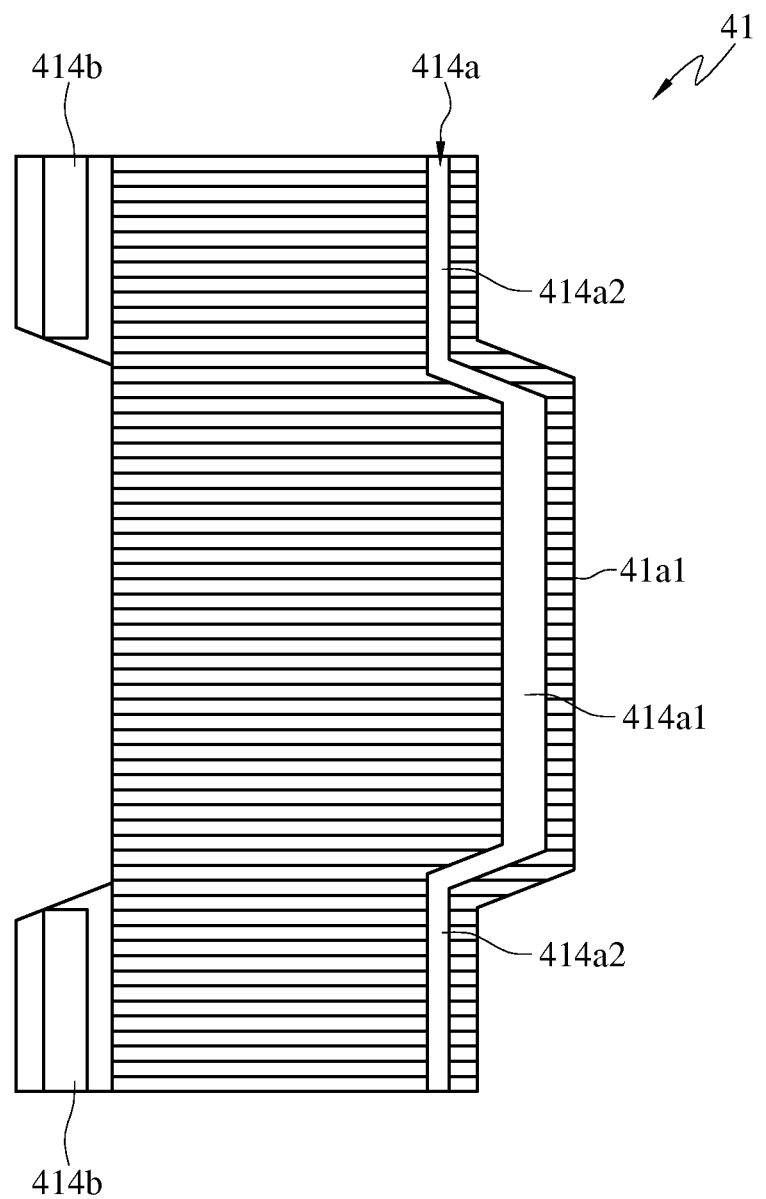
FIG. 12 is a top view of a solar cell according to another embodiment of the disclosure.
Figure 12:
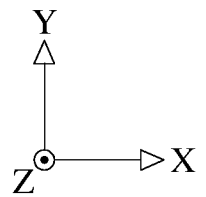

FIG. 12 is a top view of a solar cell according to another embodiment of the disclosure. As seen in FIG. 12, the solar cell 41 of this embodiment is similar to the first solar cell 11 shown in FIG. 1, FIG. 2 and FIG. 4. However, in this embodiment, the widths of the first wire 414a and the third wire 414b are defined as the widths along the positive and negative x directions. The width of the part 414a1 of the first wire 414a on 41a1 is greater than that of the other part 414a2. The width of the third wire 414b is substantially the same as that of the part 414a1 of the first wire 414a on 41a1. Since the width of the part 414a1 of the first wire 414a and the width of the third wire 414b are wider, even multiple solar cells 41 do not match perfectly, a plane parallel to the positive and negative z directions can pass through the part 414a1 of the first wire 414a and the third wire 414b. The electrically connecting member 13 shown in FIG. 1 and FIG. 2A can extend along this plane and then can be electrically connected to the part 414a1 of the first wire 414a and the third wire 414b. Moreover, since the part 414a1 of the first wire 414a and the third wire 414b are wider, they have smaller resistances, thereby reducing the output electric loss of the solar cell 41.

Figure 13:
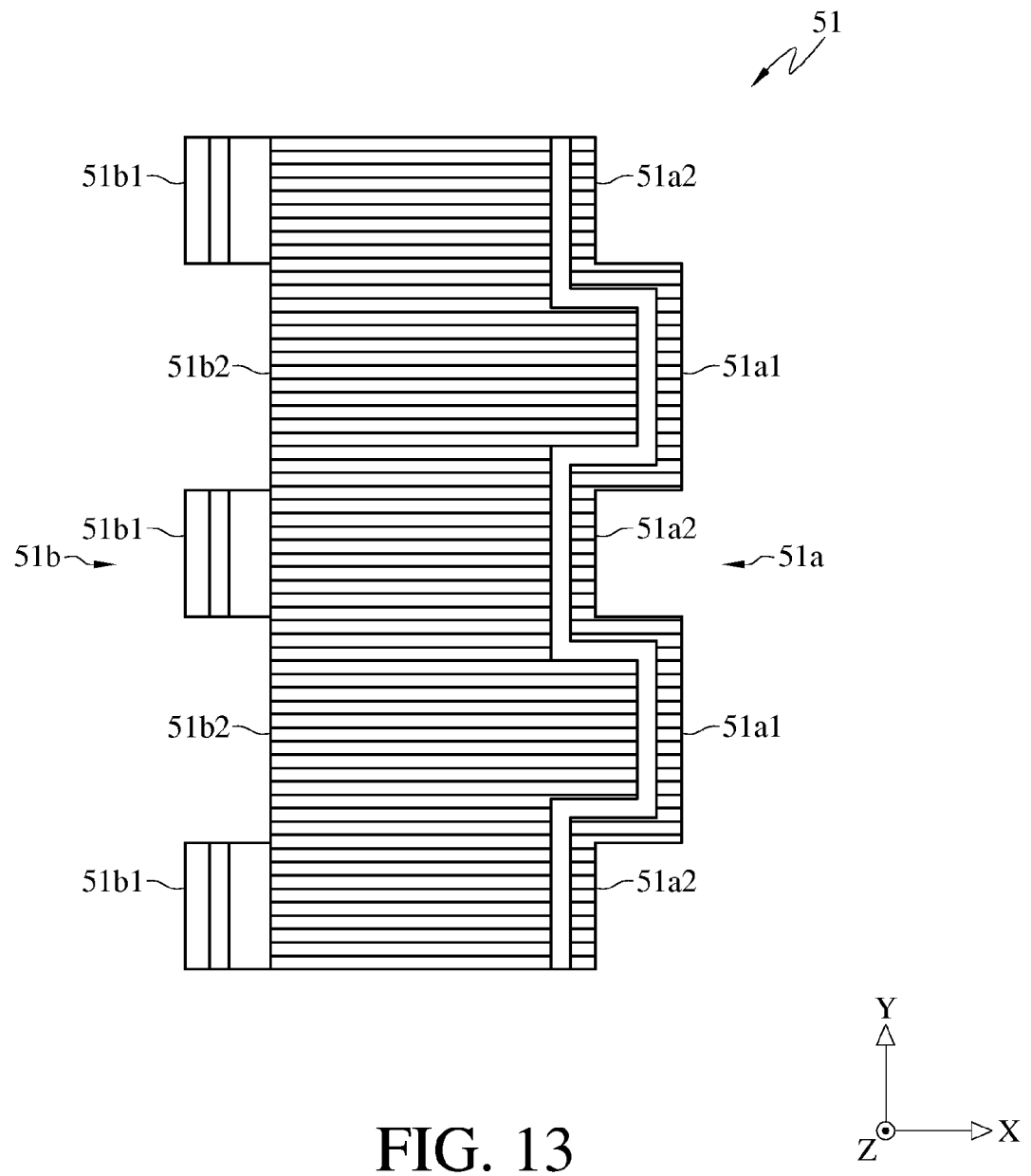
FIG. 13 is a top view of a solar cell according to another embodiment of the disclosure.

FIG. 13 is a top view of a solar cell according to another embodiment of the disclosure. As seen in FIG. 13, the first solar cell 51 of this embodiment is similar to the first solar cell 11 shown in FIG. 1, FIG. 2 and FIG. 4. However, in this embodiment, the first protruding portion 51a1 and the first recess portion 51a2 of the first connecting side 51a and the third protruding portion 51b1 and the third recess portion 51b2 of the third connecting side 51b are rectangular shapes. The number of the first protruding portions 51a1 is two, the number of the first recess portions 51a2 is three, the number of the third protruding portions 51b1 is three, and the number of the third recess portions 51b2 is two. The lengths of the first protruding portion 51a1, the first recess portion 51a2, the third protruding portion 51b1 and the third recess portion 51b2 are defined as the lengths along the positive and negative y directions. The length of the first protruding portion 51a1 is greater than that of the first recess portion 51a2, while the length of the third protruding portion 51b1 is less than that of the third recess portion 51b2. Thereby, the manufactures can adjust the shapes, numbers and lengths of the first protruding portion 51a1, the first recess portion 51a2, 1b1 and the third recess portion 51b2, so that the arrangement of the first solar cell 51 can be modified easily.

Figure 14:
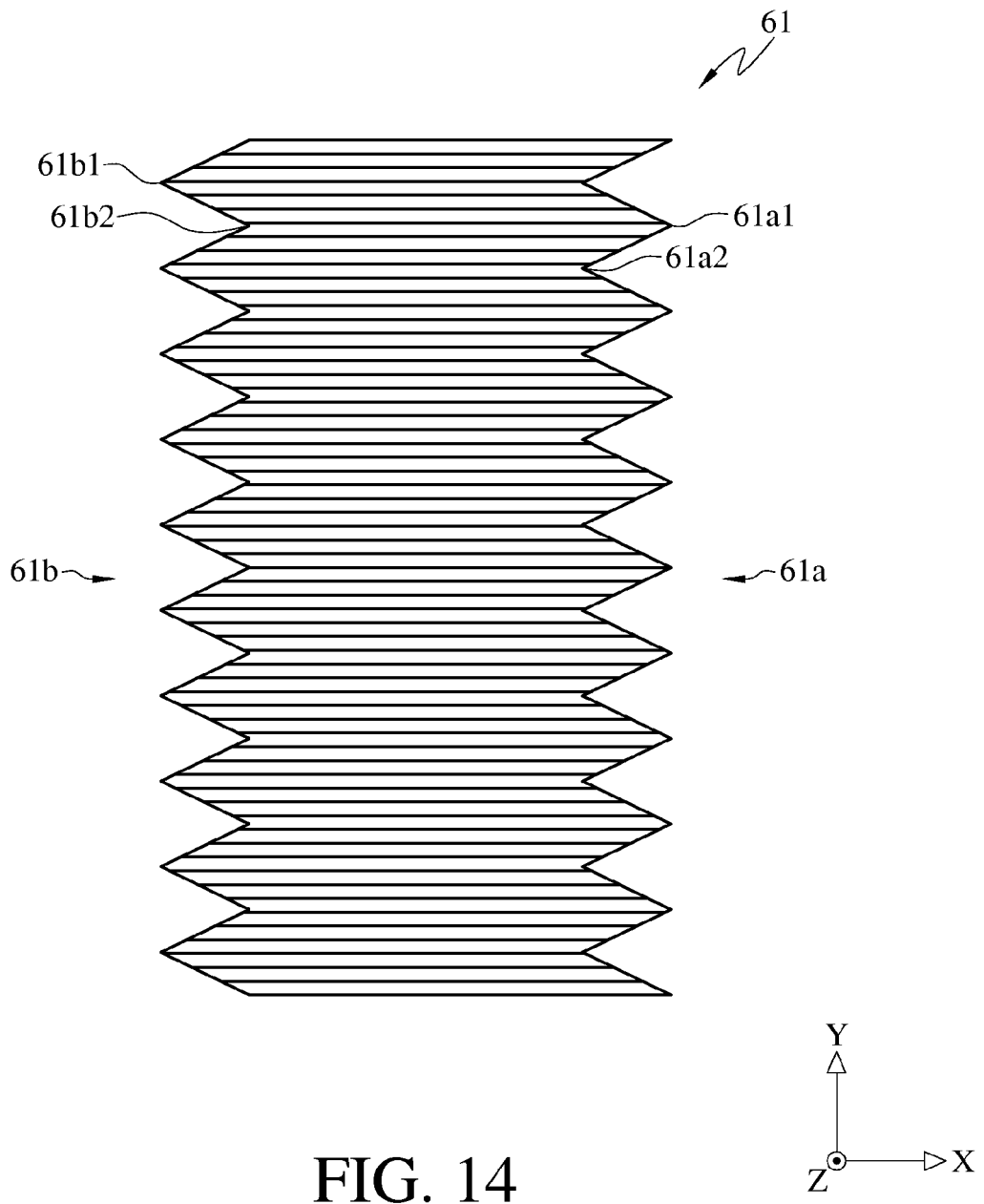
FIG. 14 is a top view of a semi-finished solar cell according to another embodiment of the disclosure.

FIG. 14 is a top view of a semi-finished solar cell according to another embodiment of the disclosure. As seen in FIG. 14, the solar cell 61 of this embodiment is similar to the first solar cell 11 shown in FIG. 1, FIG. 2 and FIG. 4. However, in this embodiment, the first protruding portion 61a1 and the first recess portion 61a2 of the first connecting side 61a and the third protruding portion 61b1 and the third recess portion 61b2 of the third connecting side 61b are isosceles triangle shapes.

Figure 15:
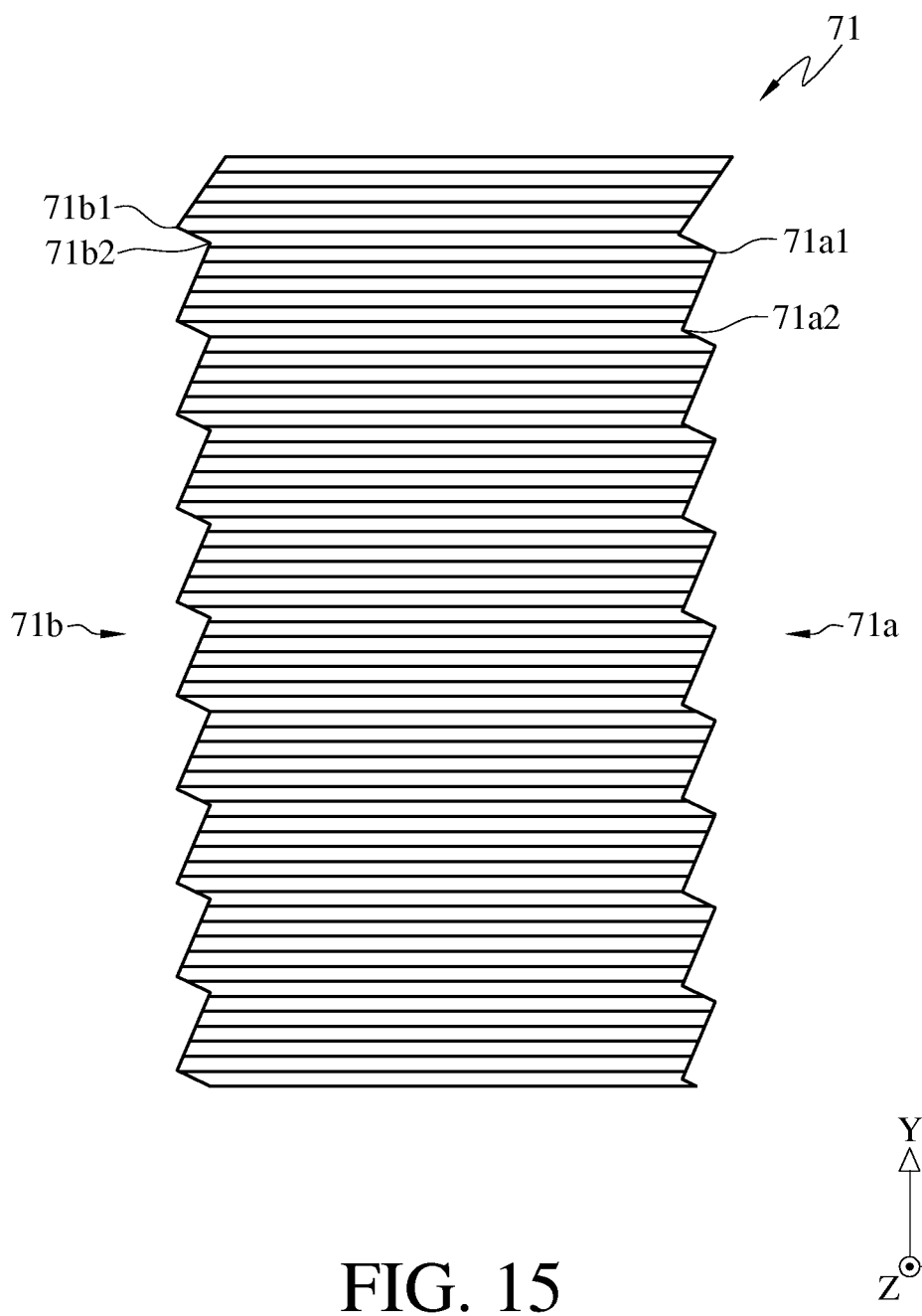
FIG. 15 is a top view of a semi-finished solar cell according to another embodiment of the disclosure.

FIG. 15 is a top view of a semi-finished solar cell according to another embodiment of the disclosure. As seen in FIG. 15, the solar cell 71 of this embodiment is similar to the first solar cell 11 shown in FIG. 1, FIG. 2 and FIG. 4. However, in this embodiment, the first protruding portion 71a1 and the first recess portion 71a2 of the first connecting side 71a and the third protruding portion 71b1 and the third recess portion 71b2 of the third connecting side 71b are non-isosceles triangle shapes.

Figure 16:
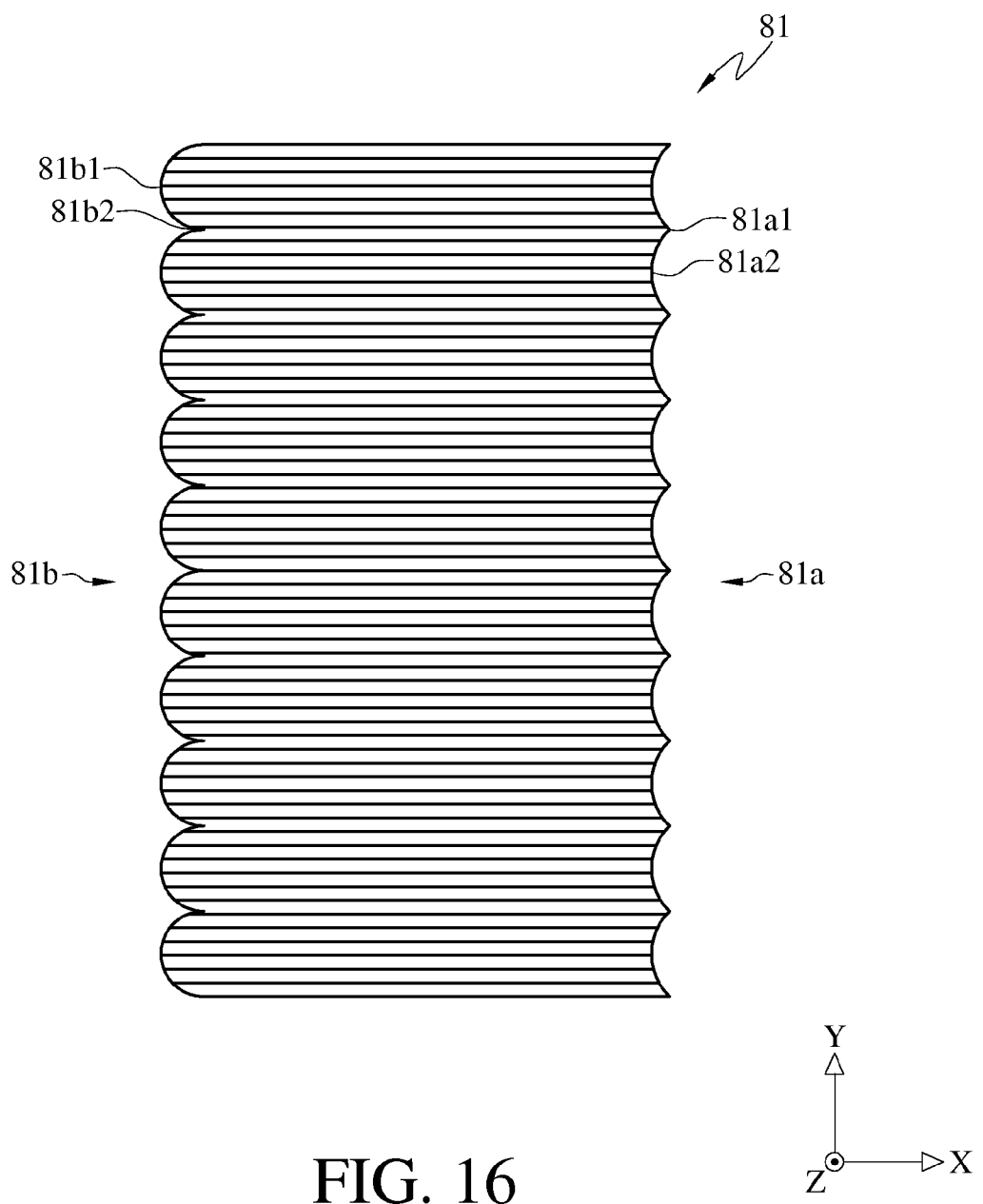
FIG. 16 is a top view of a semi-finished solar cell according to another embodiment of the disclosure.

FIG. 16 is a top view of a semi-finished solar cell according to another embodiment of the disclosure. As seen in FIG. 16, the solar cell 81 of this embodiment is similar to the first solar cell 11 shown in FIG. 1, FIG. 2A and FIG. 4. However, in this embodiment, the first connecting side 81a has the first protruding portion 81a1 and the first recess portion 81a2, while the third connecting side 81b has the third protruding portion 81b1 and the third recess portion 81b2. The shapes the first protruding portion 81a1 and the third recess portion 81b2 are pointed while the first recess portion 81a2 and the third protruding portion 81b1 are arc-shaped (or, chamfered).

Figure 17:
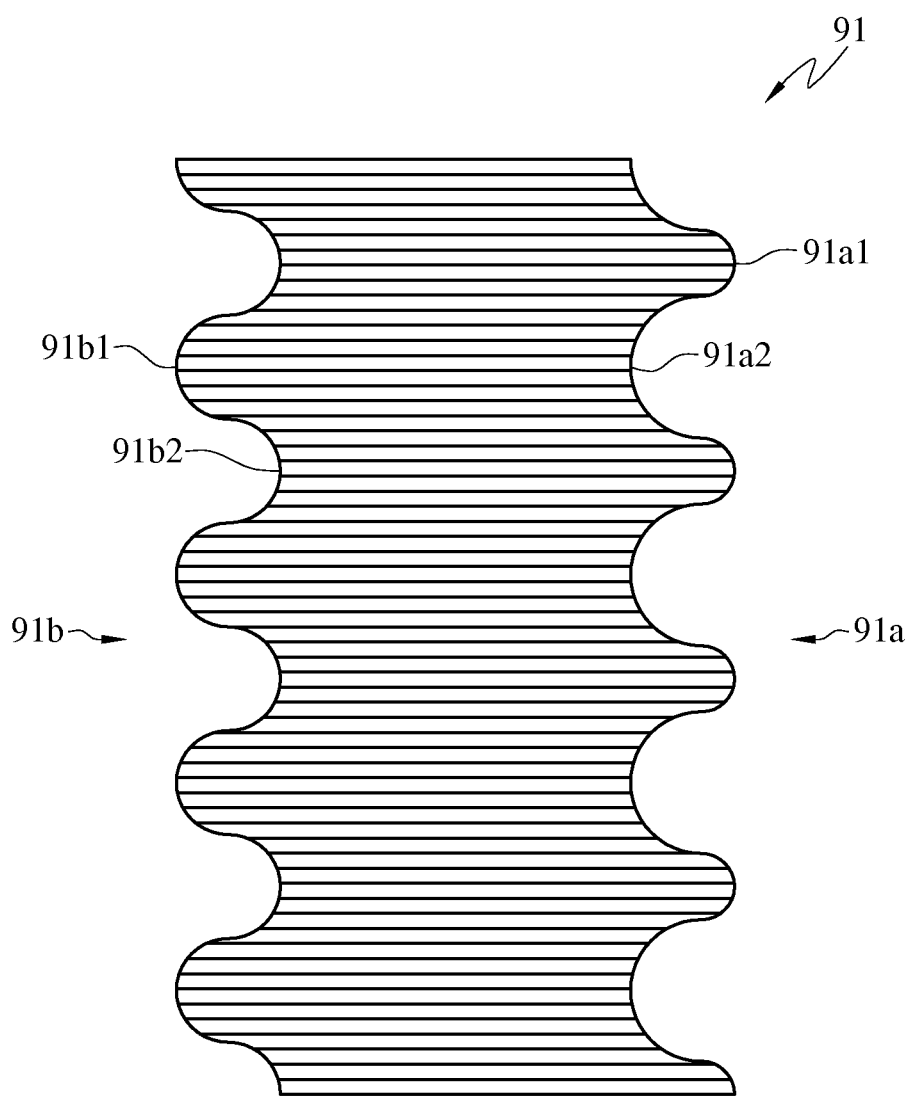
FIG. 17 is a top view of a semi-finished solar cell according to another embodiment of the disclosure.

FIG. 17 is a top view of a semi-finished solar cell according to another embodiment of the disclosure. As seen in FIG. 17, the solar cell 91 of this embodiment is similar to the first solar cell 11 shown in FIG. 1, FIG. 2 and FIG. 4. However, in this embodiment, the first protruding portion 91a1 and the first recess portion 91a2 of the first connecting side 91a and the third protruding portion 91b1 and the third recess portion 91b2 of the third connecting side 91b are arc-shaped.

Hence, the manufactures can adjust the shapes of the first protruding portions 61a1, 71a1, 81a1 and 91a1, the first recess portions 61a2, 71a2, 81a2 and 91a2, the third protruding portions 61b1, 71b1, 81b1 and 91b1, and the third recess portions 61b2, 71b2, 81b2 and 91b2, so that they can modify the arrangement of the solar cells 61, 71, 81 and 91 flexibly.

Figure 18A:
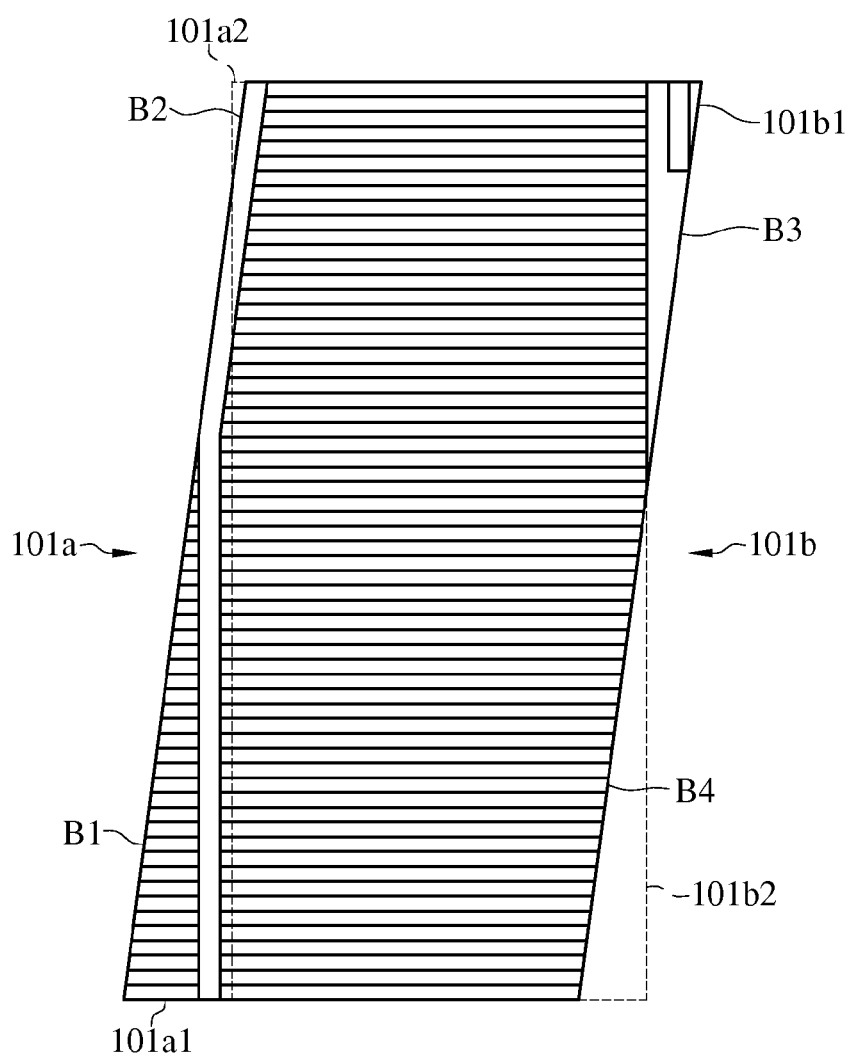
FIG. 18A is a top view of a solar cell according to another embodiment of the disclosure.

Please refer to FIG. 18A. which is a top view of a semi-finished solar cell according to another embodiment of the disclosure. The solar cell 101 of this embodiment is similar to the first solar cell 11 shown in FIG. 1, FIG. 2A and FIG. 4. However, in this embodiment, each number of the first protruding portion 101a1 and the first recess portion 101a2 of the first connecting side 101a and the third protruding portion 101b1 and the third recess portion 101b2 of the third connecting side 101b is one and each of them is right-angle triangle. Each of the first protruding portion 101a1, the first recess portion 101a2, the third protruding portion 101b1 and the third recess portion 101b2 has slopes of right-angle triangle B1, B2, B3 and B4, the slope of right-angle triangle B1 of the first protruding portion 101a1 and the slope of right-angle triangle B2 of the first recess portion 101a2 are on a same line (that is, both of the slope B1 and B2 extend along the same line), and the slope of right-angle triangle B3 of the third protruding portion 101b1 and the slope of right-angle triangle B4 of the third recess portion 101b2 are on a same line (that is, both of the slope B3 and B4 extend along the same line).

Figure 18B:
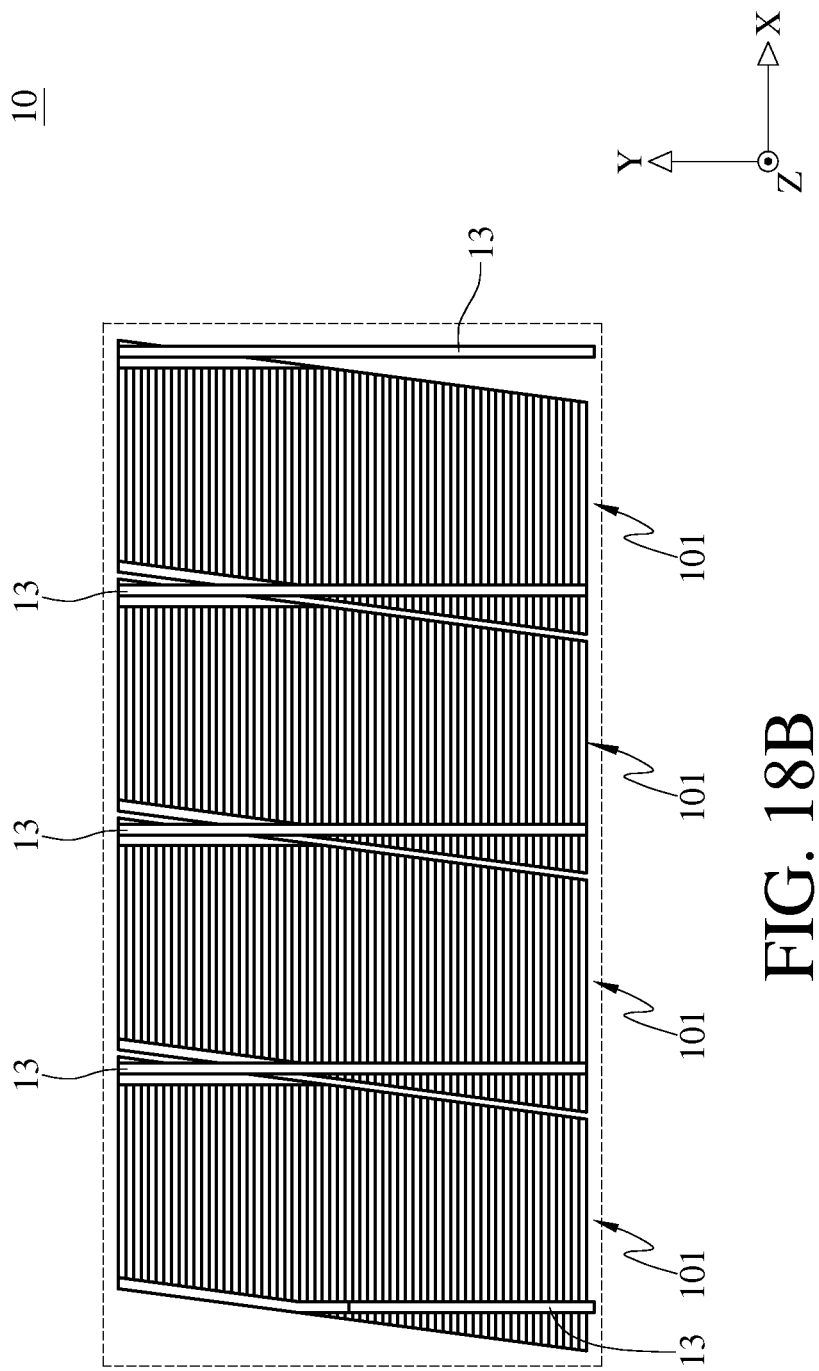
FIG. 18B is a top view of a solar cell module including a solar cell shown in FIG. 18A.

Please refer to FIG. 18B. which is a top view of a solar cell module including a solar cell shown in FIG. 18A. The solar cell module 10 of this embodiment is similar to the solar cell module 1 shown in FIG. 1 and FIG. 2A. However, in this embodiment, a plurality of solar cells 101 are arranged side by side (i.e., abreast), and the solar cells 101 are electrically connected with each other in series via the electrically connecting member 13.

Figure 18C:
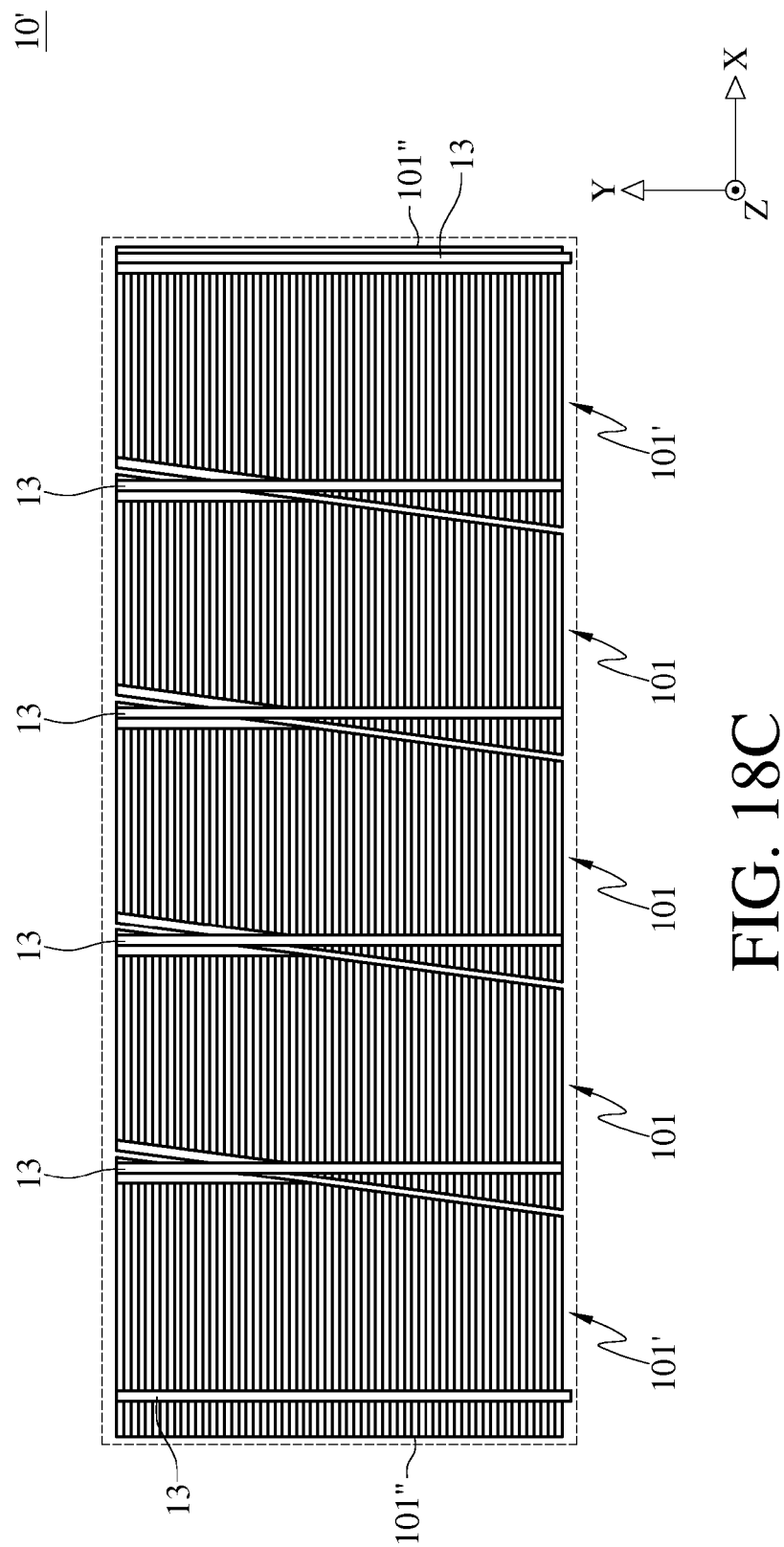
FIG. 18C is a top view of another solar cell module including the solar cell shown in FIG. 18A.

Please refer to FIG. 18C, which is a top view of another solar cell module including the solar cell shown in FIG. 18A. The solar cell module 10' of this embodiment is similar to the solar cell module 10 shown in FIG. 18B. However, in this embodiment, a plurality of solar cells 101 and 101' are arranged side by side, and one side 101" of the outermost solar cell 101' which does not face other solar cells 101 may not have any protrusion portion or recess portion. Therefore, manufacturer of the solar cell module 10' can fabricate different kinds of solar cells 101 and 101' according to actual requirement or demand to adjust the configuration and arrangement of the solar cell module 10' flexibly.

Figure 19A:
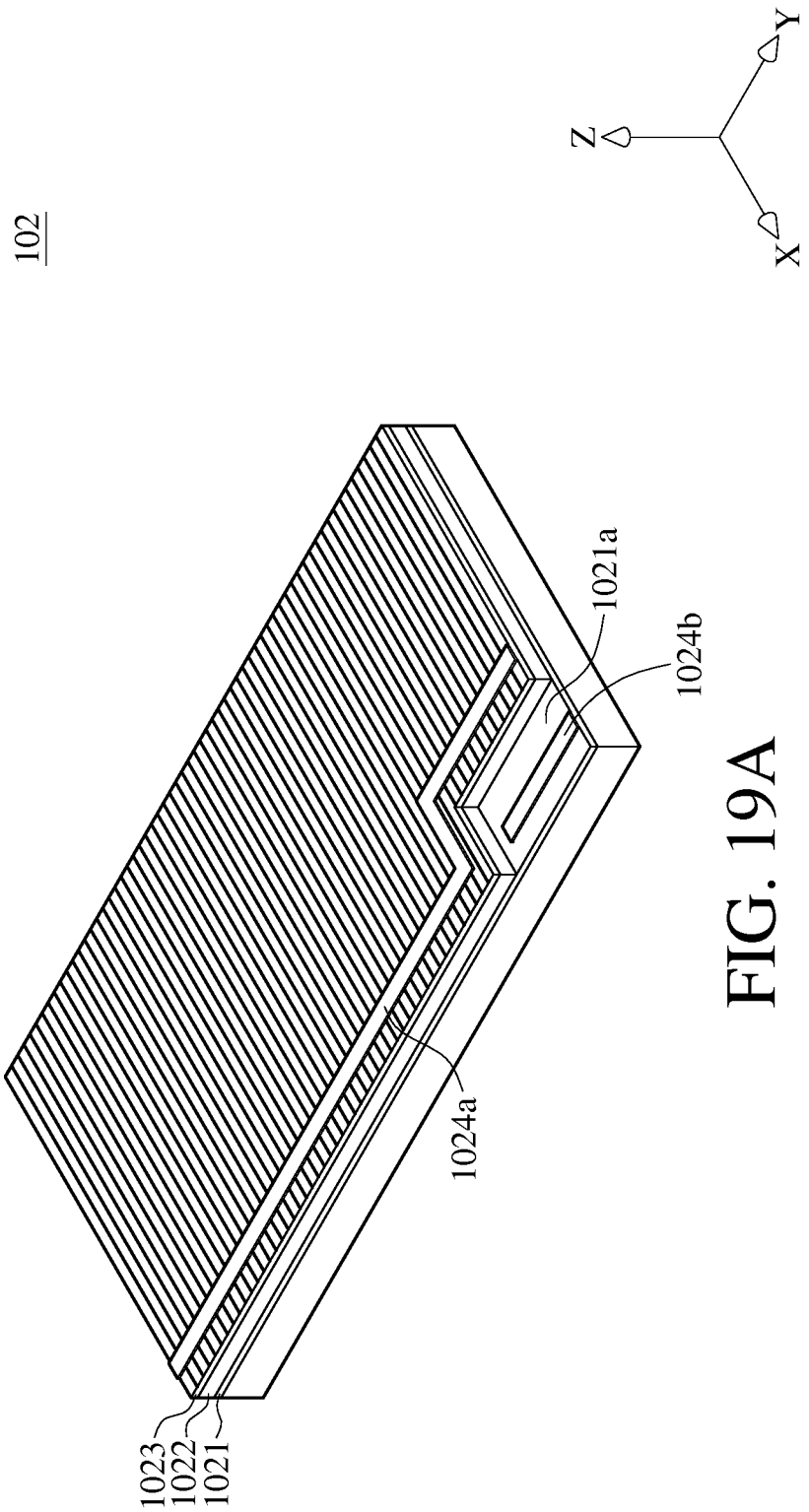
FIG. 19A is a perspective view of a solar cell according to another embodiment of the disclosure.
Figure 19B:
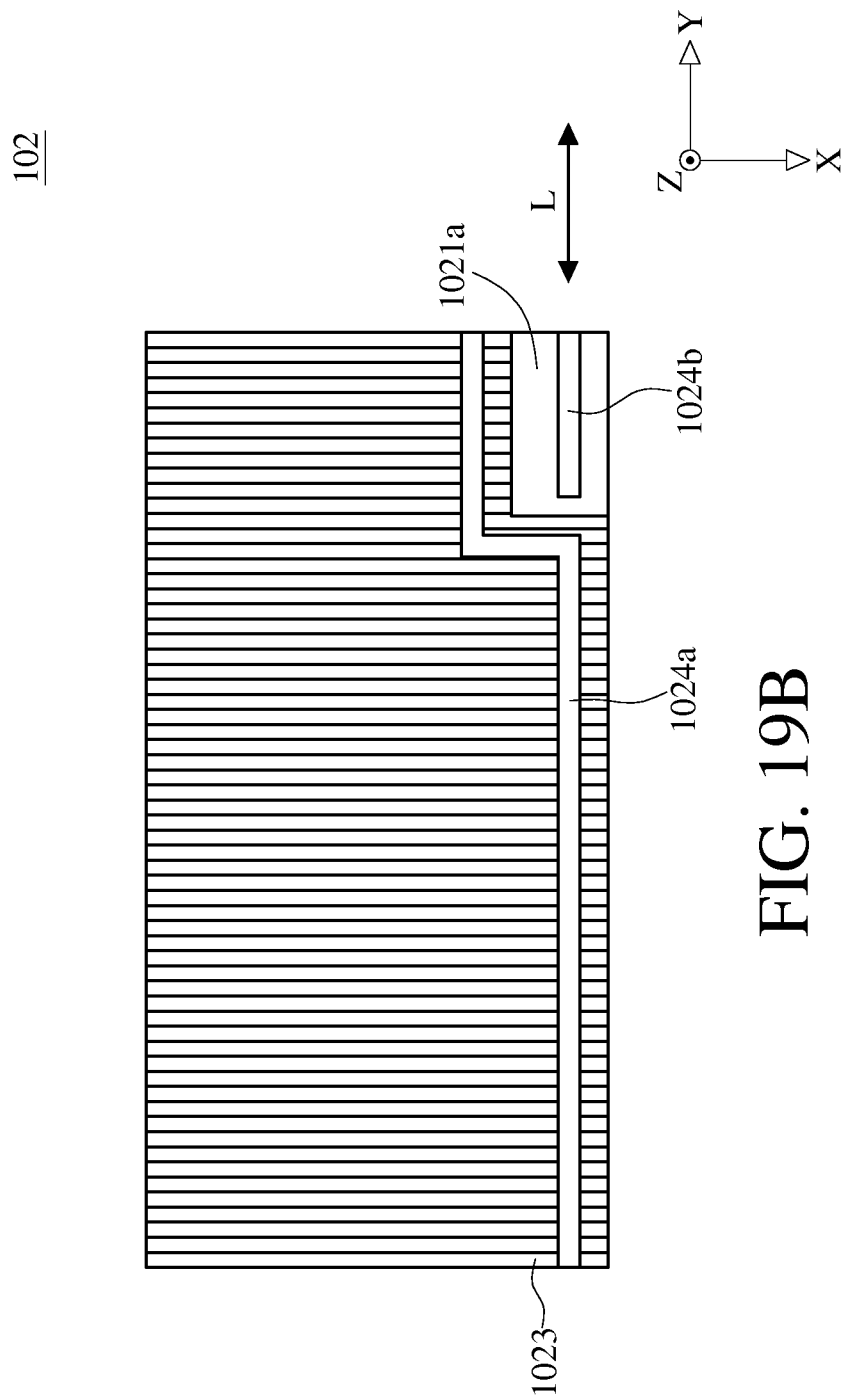
FIG. 19B is a top view of the solar cell shown in FIG. 19A.

Please refer to FIG. 19A and FIG. 19B, FIG. 19A is a perspective view of a solar cell according to another embodiment of the disclosure, and FIG. 19B is a top view of the solar cell shown in FIG. 19A. In this embodiment, the solar cell 102 comprises a photoelectric conversion active layer 1022, an upper electrode layer 1023, a lower electrode layer 1021, first wire 1024a and a second wire 1024b. The photoelectric conversion active layer 1022 comprises two surfaces opposite to each other. The upper electrode layer 1023 is disposed on one of the surfaces of the photoelectric conversion active layer 1022. The lower electrode layer 1021 is disposed on the other surface of the photoelectric conversion active layer 1022. The lower electrode layer 1021 comprises an exposed section 1021*a* on the surface facing the photoelectric conversion active layer 1022. Both of the photoelectric conversion active layer 1022 and the upper electrode layer 1023 do not cover the exposed section 1021*a* so as to expose the exposed section 1021*a*. The exposed section 1021*a* of the lower electrode layer 1021 is adjacent to an edge of the lower electrode layer 1021. The first wire 1024*a* is disposed on the upper electrode layer 1023 and adjacent to the exposed section 1021*a* of the lower electrode layer 1021. The second wire 1024*b* is disposed on the exposed section 1021*a* of the lower electrode layer 1021. At least a part of the first wire 1024*a* is overlapped with at least a part of the second wire 1024*b* along an extending direction L. The solar cell 102 can be parallelogram shape or rectangular shape.

Please refer to FIG. 19C and FIG. 19D, FIG. 19C is a top view of the multiple solar cells shown in FIG. 19B, and FIG. 19D is a top view of a solar cell module including the solar cell shown in FIG. 19B. The solar cell module 10*a* in this embodiment is similar to the solar cell module 1 shown in FIG. 1 and FIG. 2A. As shown in FIG. 19C, a plurality of solar cells 102 are arranged together. One first wire 1024*a* of one of the solar cells 102 is adjacent to one second wire 1024*b* of the other solar cell 102 next to the foregoing solar cell 102. At least part of the first wire 1024*a* and that of the second wire 1024*b* are overlapped with each along the extending direction L. As shown in FIG. 19D, since the electrically connecting member 13 is in electrical contact with first wire 1024*a* and the second wire 1024*b* shown in FIG. 19C, the solar cells 102 can be electrically connected with each other in series via the electrically connecting member 13.

Figure 20A:
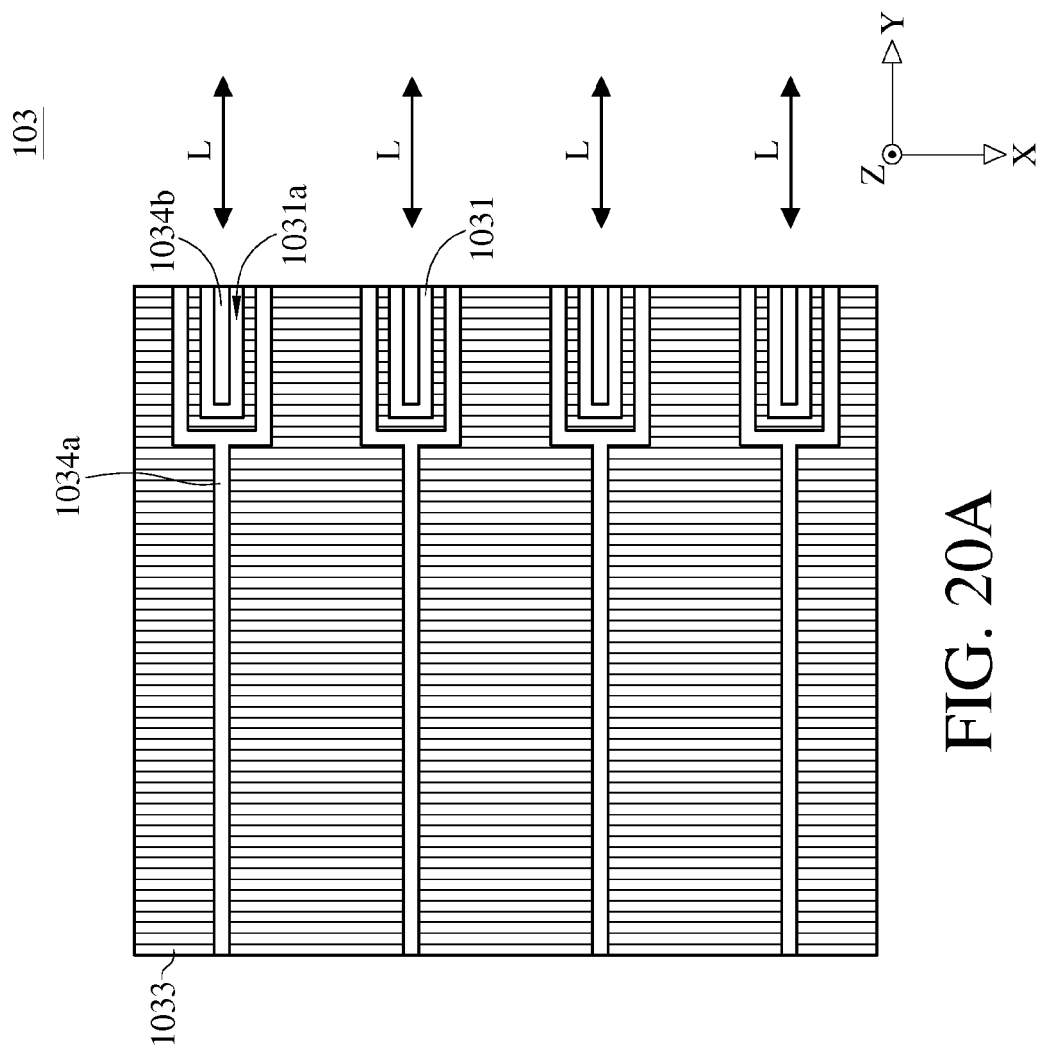
FIG. 20A is a top view of a solar cell according to another embodiment of the disclosure.

Please refer to FIG. 20A, which is a top view of a solar cell according to another embodiment of the disclosure. The solar cell 103 in this embodiment is similar to the solar cell 102 shown in FIG. 19A. However, a surface of the lower electrode layer 1031 facing the photoelectric conversion active layer (that is, the surface facing the upper electrode layer 1033, and the photoelectric conversion active layer is not shown in the drawing since the upper electrode layer 1033 covers the photoelectric conversion active layer) comprises a plurality of exposed sections 1031*a*. The exposed sections 1031*a* of the lower electrode layer 1031 are adjacent to edges of the lower electrode layer 1031. A plurality of first wires 1034*a* are disposed on the upper electrode layer 1033 and adjacent to the exposed sections 1031*a* of the lower electrode layer 1031, respectively. A plurality of second wires 1034*b* are disposed on the exposed sections 1031*a* of the lower electrode layer 1031, respectively. At least a part of one of the first wires 1034*a* is overlapped with at least a part of one of the second wire 1034*b* along the extending direction L. The solar cell 103 can be parallelogram shape or rectangular shape.

Figure 20B:
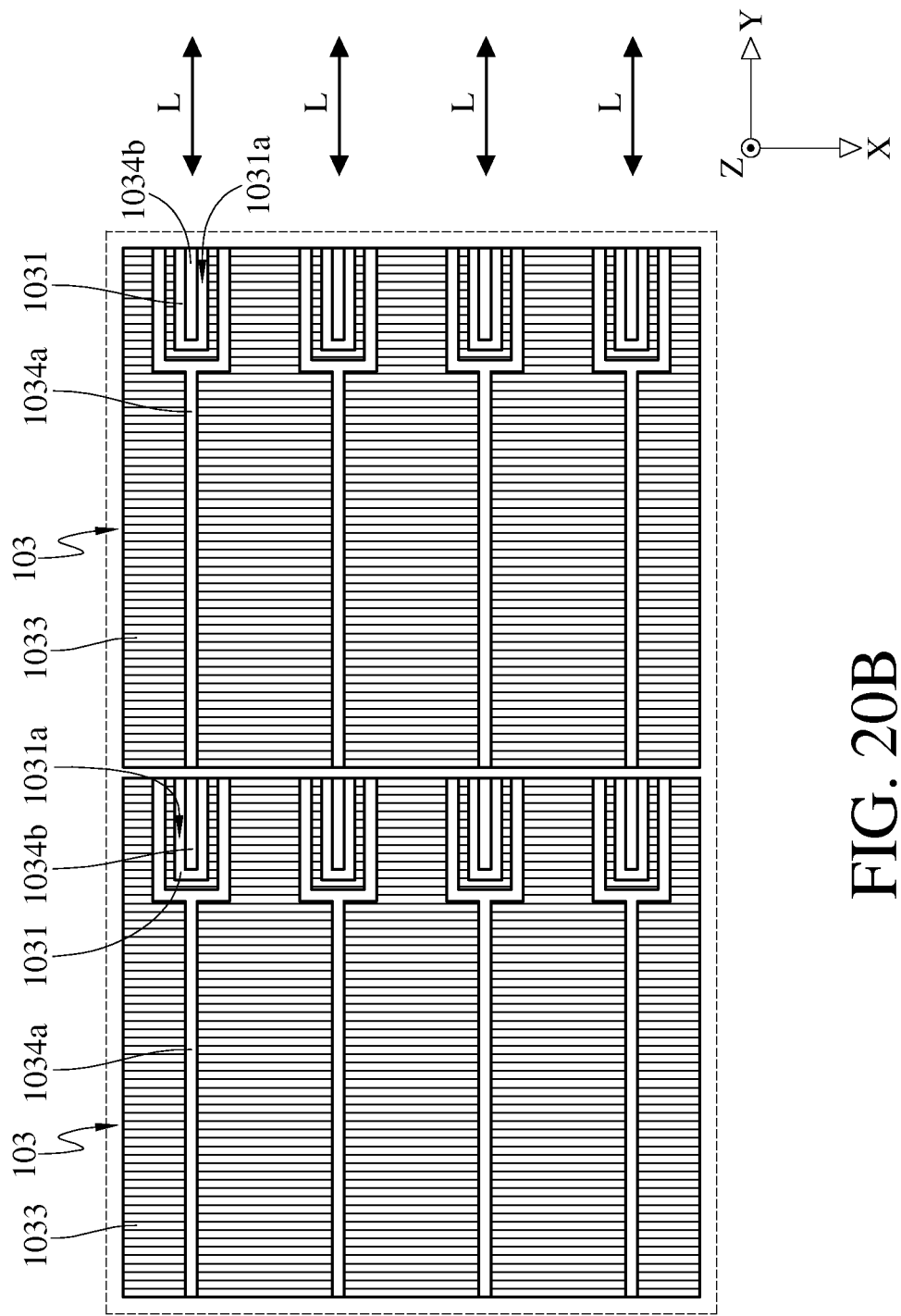
FIG. 20B is a top view of the multiple solar cells shown in FIG. 20A.
Figure 20C:
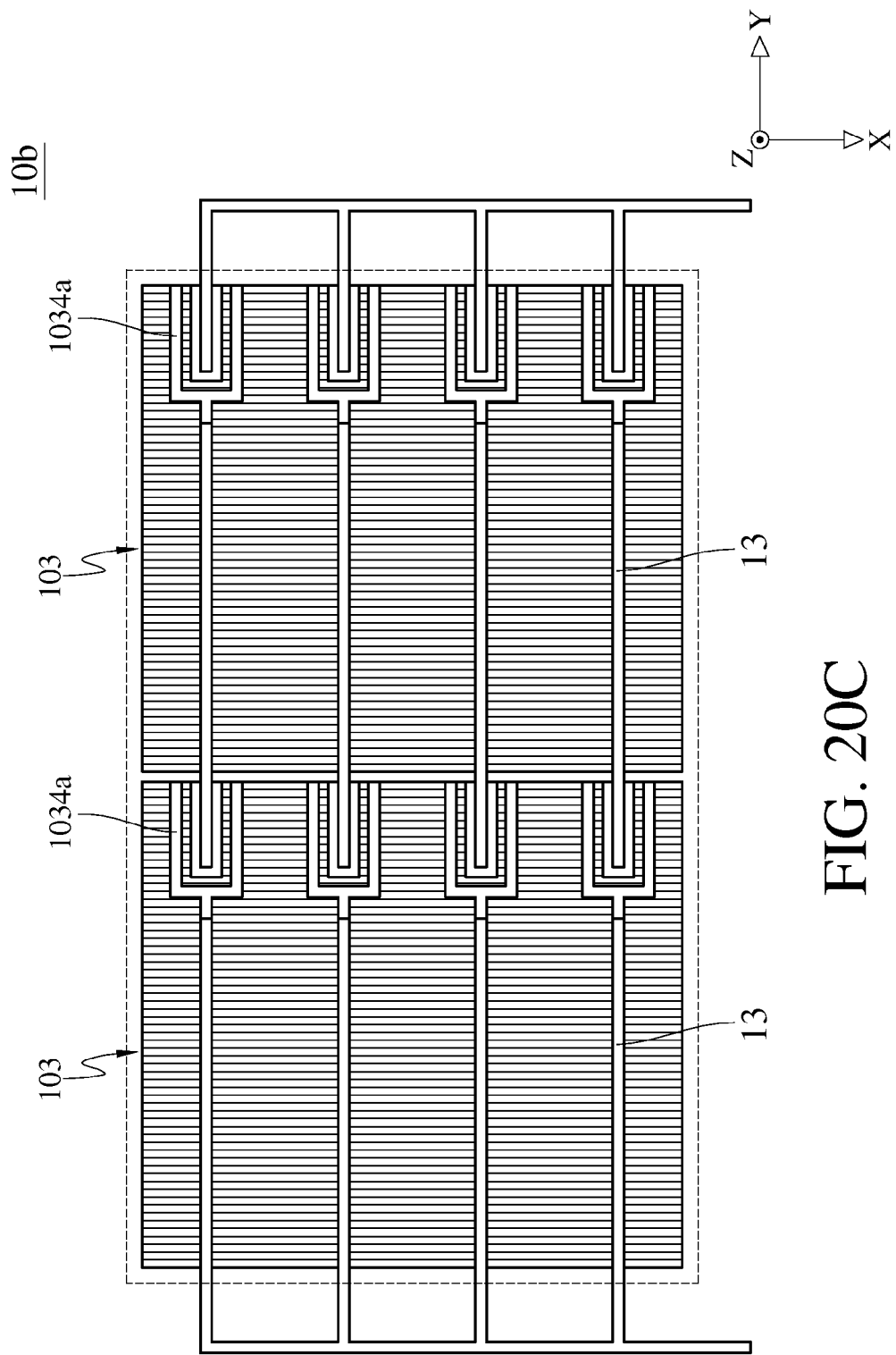
FIG. 20C is a top view of a solar cell module including the solar cell shown in FIG. 20A.

Please refer to FIG. 20B and FIG. 20C, FIG. 20B is a top view of the multiple solar cells shown in FIG. 20A, and FIG. 20C is a top view of a solar cell module including the solar cell shown in FIG. 20A. The solar cell module 10*b* in this embodiment is similar to the solar cell module 10*a* shown in FIG. 19C. As shown in FIG. 20B, a plurality of solar cells 103 are arranged together One first wire 1034*a* of one of the solar cells 103 is adjacent to one second wire 1034*b* of the other solar cell 103 next to the foregoing solar cell 103. At least part of the first wire 1034*a* and that of the second wire 1034*b* are overlapped with each along the extending direction L. As shown in FIG. 20C, since the electrically connecting member 13 is in electrical contact with first wire 1034*a* and the second wire 1034*b* shown in FIG. 20B, the solar cells 103 can be electrically connected with each other in series via the electrically connecting member 13.

To sum up, in the solar cell module of the disclosure, since the first protruding portion and the second protruding portion are alternatively arranged, the electrically connecting member can electrically connect the first upper electrode layer of the first protruding portion and the second lower electrode layer of the second protruding portion. Alternatively, since the first wire disposed on the first upper electrode layer is adjacent to the second wire disposed on the second lower electrode layer, the electrically connecting member can electrical connect the first wire disposed on the first upper electrode layer and the second wire disposed on the second lower electrode layer along a linear direction. Thereby, multiple solar cells can be interconnected in series or in parallel, without flipping the solar cell module over. This makes the manufacturing of large solar cell module easier. Since the electrically connecting member electrical connects the first wire disposed on the first upper electrode layer and the second wire disposed on the second lower electrode layer along the linear direction, photocurrent collected by the first wire and the second wire can rapidly transmit to the electrically connecting member which can be made of metal with low electrical resistance. Thus, the serial resistance of the solar cell module in the disclosure can be greatly reduced so as to enhance the efficiency of power generation. Furthermore, electrically interconnecting the solar cell module in this way narrows the width of the electrically connecting member to the utmost, thereby reducing the cost of the material. Additionally, the narrower the electrically connecting members are, the lower the light-shading areas of the first solar cell and the second solar cell are. This increases the converting efficiency of the solar cell module.

What is claimed is:

1. A solar cell module comprising:
   a first solar cell comprising a first upper electrode layer, a first photoelectric conversion active layer and a first lower electrode layer, the first photoelectric conversion active layer being disposed between the first upper electrode layer and the first lower electrode layer, the first solar cell having a first connecting side having at least one first protruding portion and at least one first recess portion that are adjacent to each other, an upper surface of the at least one first protruding portion being a part of the first upper electrode layer;
   a second solar cell comprising a second upper electrode layer, a second photoelectric conversion active layer and a second lower electrode layer, the second photoelectric conversion active layer being disposed between the second upper electrode layer and the second lower electrode layer, the second solar cell having a second connecting side having at least one second protruding portion and at least one second recess portion that are adjacent to each other, wherein an upper surface of the at least one second protruding portion is a part of the second lower electrode layer that is not covered by the second photoelectric conversion active layer and the second upper electrode layer, the first solar cell is arranged next to the second solar cell such that the first connection side of the first solar cell is adjacent to the second connection side of the second solar cell, a shape of the at least one first protruding portion is corresponding to a shape of the at least one second recess portion, a shape of the at least one first recess portion is corresponding to a shape of the at least one second protruding portion, and the upper surface of the at least one first protruding portion and the upper surface of the at least one second protruding portion are arranged in a line and do not overlap with each other; and
an electrically connecting member disposed on the upper surface of the at least one first protruding portion and on the upper surface of the at least one second protruding portion, such that the first upper electrode layer and the second lower electrode layer are electrically connected.

2. The solar cell module according to claim 1, wherein the first solar cell and the second solar cell are separated from each other by a distance and only electrically connected through the electrically connecting member.

3. The solar cell module according to claim 1, wherein the first solar cell further has a third connecting side opposite to the first connecting side, the third connecting side has at least one third protruding portion and at least one third recess portion that are adjacent to each other, an upper surface of the at least one third protruding portion is a part of the first lower electrode layer that is not covered by the first photoelectric conversion active layer and the first upper electrode layer, the second solar cell further has a fourth connecting side opposite to the second connecting side, and the fourth connecting side has at least one fourth protruding portion and at least one fourth recess portion that are adjacent to each other.

4. The solar cell module according to claim 1, wherein the first solar cell further comprises a first substrate, the first lower electrode layer is disposed between the first substrate and the first photoelectric conversion active layer, the second solar cell further comprises a second substrate, the second lower electrode layer is disposed between the second substrate and the second photoelectric conversion active layer.

5. The solar cell module according to claim 1, wherein the first solar cell further comprises a first wire disposed on the first upper electrode layer and next to the first connecting side of the first solar cell and electrically connected to the electrically connecting member, and the second solar cell further comprises a second wire disposed on the upper surface of the at least one second protruding portion and is electrically connected to the electrically connecting member.

6. The solar cell module according to claim 5, wherein a width of a part of the first wire located on the first protruding portion is larger than a width of the remaining part of the first wire.

7. The solar cell module according to claim 1, further comprising a back plate, wherein the first solar cell and the second solar cell are disposed on the back plate.

8. The solar cell module according to claim 7, wherein the back plate has a curved surface.

9. The solar cell module according to claim 7, further comprising an adhesive layer, the first solar cell and the second solar cell are attached to the back plate via the adhesive layer.

10. The solar cell module according to claim 1, further comprising a cover plate covering the first solar cell, the second solar cell and the electrically connecting member.

11. The solar cell module according to claim 10, further comprising an adhesive layer, wherein the cover plate covers and is attached to the first solar cell, the second solar cell and the electrically connecting member via the adhesive layer.

12. The solar cell module according to claim 1, wherein a number of the protruding portions located at the first connecting side equals to a number of the recess portions located at the second connecting side, and a number of the recess portions located at the first connecting side equals to a number of the protruding portions located at the second connecting side.

13. A solar cell module, comprising:
a first solar cell comprising a first upper electrode layer, a first photoelectric conversion active layer, a first lower electrode layer and a first wire, wherein the first photoelectric conversion active layer is disposed between the first upper electrode layer and the first lower electrode layer, the first lower electrode layer has a first exposed section that faces upward and is not covered by the first photoelectric conversion active layer and the first upper electrode layer, and the first wire is disposed on the first upper electrode layer and adjacent to the first exposed section;
a second solar cell comprising a second upper electrode layer, a second photoelectric conversion active layer, a second lower electrode layer and a second wire, wherein the second photoelectric conversion active layer is disposed between the second upper electrode layer and the second lower electrode layer, the second lower electrode layer has a second exposed section that faces upward and is not covered by the second photoelectric conversion active layer and the second upper electrode layer, the second wire is disposed on the second exposed section of the second lower electrode layer, the first solar cell and the second cell are arranged side by side, the first wire is adjacent to the second wire, the first wire comprises a first straight section, an extending direction of the first straight section is toward the second exposed section, and the extending direction of the first straight section is aligned with the second wire; and
an electrically connecting member disposed on the first wire and the second wire, electrically connecting the first wire and the second wire.

14. The solar cell module according to claim 13, wherein the first solar cell and the second solar cell are separated from each other by a distance and only electrically connected through the electrically connecting member.

15. The solar cell module according to claim 13, wherein the first solar cell further comprises a third wire disposed on the first exposed section of the first lower electrode layer, and the second solar cell further comprises a fourth wire disposed on the second upper electrode layer and adjacent to the second exposed section of the second lower electrode layer.

16. The solar cell module according to claim 13, wherein the first solar cell further comprises a first substrate, the first lower electrode layer is disposed between the first substrate and the first photoelectric conversion active layer, the second solar cell further comprises a second substrate, the second lower electrode layer is disposed between the second substrate and the second photoelectric conversion active layer.

17. The solar cell module according to claim 13, further comprising a back plate, wherein the first solar cell and the second solar cell are disposed on the back plate.

18. The solar cell module according to claim 17, wherein the back plate has a curved surface.

19. The solar cell module according to claim 17, further comprising an adhesive layer, the first solar cell and the second solar cell are attached to the back plate via the adhesive layer.

20. The solar cell module according to claim 13, further comprising a cover plate covering the first solar cell, the second solar cell and the electrically connecting member.

21. The solar cell module according to claim 20, further comprising an adhesive layer, wherein the cover plate covers and is attached to the first solar cell, the second solar cell and the electrically connecting member via the adhesive layer.

* * * * *